(12) United States Patent
Kinghorn et al.

(10) Patent No.: US 9,817,197 B2
(45) Date of Patent: Nov. 14, 2017

(54) OPTICALLY ALIGNED HYBRID SEMICONDUCTOR DEVICE AND METHOD

(71) Applicant: Coriant Advanced Technology, LLC, New York, NY (US)

(72) Inventors: David Henry Kinghorn, Carpinteria, CA (US); Ari Jason Novack, New York, CA (US); Holger N. Klein, Santa Barbara, CA (US); Nathan A. Nuttall, Castaic, CA (US); Kishor V. Desai, Fremont, CA (US); Daniel J. Blumenthal, Santa Barbara, CA (US); Michael J. Hochberg, New York, NY (US); Ruizhi Shi, New York, NY (US)

(73) Assignee: Elenion Technologies, LLC, New York, NY (US)

( * ) Notice: Subject to any disclaimer, the term of this patent is extended or adjusted under 35 U.S.C. 154(b) by 0 days.

(21) Appl. No.: 15/087,278

(22) Filed: Mar. 31, 2016

(65) Prior Publication Data

US 2016/0291265 A1 Oct. 6, 2016

Related U.S. Application Data

(60) Provisional application No. 62/141,650, filed on Apr. 1, 2015.

(51) Int. Cl.
*G02B 6/42* (2006.01)
*G02B 6/13* (2006.01)
(Continued)

(52) U.S. Cl.
CPC ............ *G02B 6/423* (2013.01); *G02B 6/131* (2013.01); *G02B 6/136* (2013.01); *G02B 6/4238* (2013.01); *G02B 6/4251* (2013.01); *G02B 6/4268* (2013.01); *G02B 6/4274* (2013.01); *H01L 25/16* (2013.01); *H01L 25/162* (2013.01); *H01L 25/50* (2013.01); *H01L 31/125* (2013.01);
(Continued)

(58) Field of Classification Search
CPC .................................................. G02B 6/423
See application file for complete search history.

(56) References Cited

U.S. PATENT DOCUMENTS

| 4,109,818 A | 8/1978 | Hascoe |
| 4,750,799 A | 6/1988 | Kawachi |

(Continued)

OTHER PUBLICATIONS

International Search Report, PCT/US2016/25330, dated Jun. 30, 2016 (2 pages).

(Continued)

*Primary Examiner* — Omar R Rojas
(74) *Attorney, Agent, or Firm* — Nixon Peabody LLP

(57) ABSTRACT

Two semiconductor chips are optically aligned to form a hybrid semiconductor device. Both chips have optical waveguides and alignment surface positioned at precisely-defined complementary vertical offsets from optical axes of the corresponding waveguides, so that the waveguides are vertically aligned when one of the chips is placed atop the other with their alignment surface abutting each other. The position of the at least one of the alignment surface in a layer stack of its chip is precisely defined by epitaxy. The chips are bonded at offset bonding pads with the alignment surfaces abutting in the absence of bonding material therebetween.

10 Claims, 20 Drawing Sheets

(51) Int. Cl.
*G02B 6/136* (2006.01)
*H01L 31/12* (2006.01)
*H01L 31/18* (2006.01)
*H01L 25/00* (2006.01)
*G02B 6/12* (2006.01)
*H01L 25/16* (2006.01)

(52) U.S. Cl.
CPC ........ *H01L 31/18* (2013.01); *G02B 2006/121* (2013.01); *G02B 2006/12061* (2013.01); *G02B 2006/12097* (2013.01); *H01L 25/167* (2013.01); *Y02P 70/521* (2015.11)

(56) References Cited

U.S. PATENT DOCUMENTS

| | | | |
|---|---|---|---|
| 5,023,881 | A | 6/1991 | Ackerman |
| 5,321,786 | A | 6/1994 | Valette |
| 5,898,806 | A | 4/1999 | Nishimoto |
| 6,238,100 | B1 | 5/2001 | Sasaki |
| 6,294,018 | B1 | 9/2001 | Hamm |
| 6,392,296 | B1 | 5/2002 | Ahn |
| 6,888,989 | B1 * | 5/2005 | Zhou .................... G02B 6/3636 385/131 |
| 6,981,806 | B2 | 1/2006 | Benzoni |
| 7,213,978 | B2 | 5/2007 | Kuhmann |
| 7,397,995 | B2 | 7/2008 | Blauvelt |
| 7,402,207 | B1 | 7/2008 | Besser |
| 7,643,710 | B1 | 1/2010 | Liu |
| 8,805,129 | B2 * | 8/2014 | Han ....................... G02B 6/423 385/129 |
| 9,324,682 | B2 * | 4/2016 | Marchena ............... H01L 24/83 |
| 2003/0081902 | A1 | 5/2003 | Blauvelt |
| 2003/0201462 | A1 | 10/2003 | Pommer |
| 2003/0219192 | A1 | 11/2003 | Crafts |
| 2006/0093002 | A1 | 5/2006 | Park |
| 2006/0120660 | A1 | 6/2006 | Rolston |
| 2014/0319656 | A1 | 10/2014 | Marchena |

OTHER PUBLICATIONS

Written Opinion of the International Searching Authority, PCT/US2016/25330, dated Jun. 30, 2016 (8 pages).
R. E. Camacho-Aguilera, "An Electrically Pumped Germanium Laser," Opt. Express, vol. 20, No. 10, May 2, 2012 (pp. 11316-11320).
T. Wang, "1.3-μm InAs/GaAs Quantum-Dot Lasers Monolithically Grown on Si Substrates," Opt. Express, vol. 19, No. 12 May 26, 2011 (pp. 11381-11386).
W. Fang, "Integrated AlGaInAs-Silicon Evanescent Racetrack Laser and Photodetector," Optics Express, vol. 15, No. 5, Feb. 16, 2007 (pp. 2315-2322).
S. Keyvaninia, "Demonstration of a Heterogeneously Integrated III-V/SOI Single Wavelength Tunable Laser," Optics Express, vol. 21, No. 3, Feb. 7, 2013, (pp. 3784-3792).
J. Zilkie, "Power-efficient III-V/silicon External Cavity DBR Lasers," Optics Express, vol. 20, No. 21, Sep. 27, 2012 (pp. 23456-23462).
S. Tanaka, "High-output-power, Single-wavelength Silicon Hybrid Laser Using Precise Flip-Chip Bonding Technology," Optics Express, vol. 20, No. 27, Dec. 4, 2012 (pp. 28057-28069).
G. Li, "A CMOS Wafer-Scale, Monolithically Integrated WDM Platform for TB/s Optical Interconnects," Optical Society of America, Optical Fiber Communication Conference, 2014 (3 pages).
J. Zilkie, "High-efficiency Hybrid III-V/Si External Cavity DBR Laser for 3-μm SOI Waveguides," Proceedings of the IEEE, 2012, vol. 3, (pp. 317-319).
Kei Watanabe, "Silica-based Optical Interposer for Si Photonics", CLEO-Europe, Jun. 2009, (1 page).
Terry Bowen, "Silicon Interposer for Compact Right Angle Coupling of Flip Chip VCSEL and Detector Arrays to Multi-Facet Endface Optical Fibers", Pan Pacific Symposium, Jan. 2011, (7 pages).
L.E. Gates, "Hermetic Passivation of Chip-On-Board Circuits", Electronic Components and Technology Conference, May 1991 Proceedings, 41st, (pp. 813-819).
T. Creazzo, "Integrated Tunable CMOS Laser," Optics Express, vol. 21, No. 23, Nov. 7, 2013 (pp. 28048- 28053).
S. Yang, "A Single Adiabatic Microring-based Laser in 220 nm Silicon-on-insulator," Optics Express, vol. 22, No. 1, Jan. 10, 2014 (pp. 1172-1180).
J. H. Lee, "High Power and Widely Tunable Si Hybrid External-cavity Laser for Power Efficient Si Photonics WDM Links," Optics Express, vol. 22, No. 7, Mar. 26, 2014 (pp. 7678-7685).
Terry Bowen, "Silicon V-Groove Alignment Bench for Optical Component Assembly", TE Connectivity, Pan Pacific Symposium, Jan. 2013, (5 pages).
Gustina B. Collins, "Design, Fabrication and Testing of Conformal, Localized Wafer-Level Packaging for RF MEMS Devices", Ph.D. Dissertation of the Virginia Polytechnic Institute and State University, Jun. 5, 2006 (209 pages).

\* cited by examiner

OPTICALLY ALIGNED HYBRID SEMICONDUCTOR DEVICE AND METHOD

CROSS-REFERENCE TO RELATED APPLICATIONS

This application claims priority to U.S. Patent Application No. 62/141,650, filed Apr. 1, 2015, which is hereby incorporated by reference herein in its entirety.

TECHNICAL FIELD

The present invention generally relates to photonic integrated circuits, and more particularly relates to photonic integrated circuits formed of two or more optically aligned photonic chips and methods for fabrication thereof.

BACKGROUND

Photonic integrated circuits (PICs) may be formed in a single chip or may include two or more optical chips when it is difficult or inconvenient to form all desired optical components of the circuit in a same material system. For example Silicon on Insulator (SOI) technology enables to form optical circuits including a variety of passive and active optical elements, such as optical waveguides, splitters, combiners, filters, wavelength multiplexers and demultiplexer, modulators, resonators, and the like, in a single SOI chip. However silicon (Si) substrates are poorly suited for fabricating light sources such as laser or light emitting diodes, which typically require compound semiconductor systems such as Gallium Arsenide (GaAs) or Indium Phosphide (InP) based. Thus a PIC that includes both light-generating elements and light processing elements may typically be a hybrid circuit wherein a laser or LED chip is optically and mechanically coupled to a SOI chip or the like containing light processing circuitry.

Multi-chip PICs require a continuous optical path between the chips. Optical waveguides of two optically adjacent chips in a multi-chip PIC must be aligned at a chip interface so that the optical loss is minimized and the integrity and quality of the optical signal can be preserved. That typically requires a high precision three-axis mechanical manipulation of the chips. The position of one chip with respect to another may be described using an (x,y,z) Cartesian coordinate system wherein the x- and y-axes are typically assumed to be directed in the plane of the substrate of one of the chips, which may be referred to as the carrier, and the z-axis is directed in a direction normal to the main plane of the carrier substrate, which may also be referred to as the vertical direction.

The fabrication and packaging of very small dimension waveguide structures, often based on two or more material systems and different semiconductor chips, must be accomplished with high precision along an optical reference line that requires precision alignment linear along the three axes and with respect to three angles of rotation about these axes. The final alignment must be performed in a low cost manufacturable manner, then be fixed so that the alignment does not change with environment conditions and over the lifetime of the module or subassembly. These linear and rotational alignments occur during the assembly process where a pair of chips or a multiplicity of chips are aligned to each other, and then assembled either to each other, or assembled to an additional chip or substrate, maintaining their alignment to each other.

Modern semiconductor precision placement equipment is typically much better suited for accurate micron- and sub-micron alignment of chips in the (x,y) plane of the substrate, than in the z-direction that is vertical to the substrate plane. While accurate sub-micron alignments on two of the three axes, x and y, is normally within the rapid assembly times and capabilities of modern semiconductor precision positioning equipment, the end-to end alignment of two planar waveguides in the vertical (z) direction is typically more difficult due to the lack of z-axis fiduciaries and alignment tools. The vertical alignment for the end-to-end optical transfer may also be very sensitive to tolerance buildups that may occur when assembling multiple chips.

In order to overcome these difficulties and accommodate the variation in thickness and tolerance buildup in a direction orthogonal to the waveguide's broad flat surface, active alignment techniques may be employed, which include launching light into an optical waveguide of one of the chips and measuring light transferred into the second chip while adjusting the relative positioning and orientation of the chips so as to maximize the light transfer between the chips. Although the active alignment techniques, when used, may provide desired accuracy of optical alignment between chips, it may be inconvenient to use, and generally increases the cost, time and complexity of assembling multi-chip modules and subassemblies.

There is a need for improved methods of optical alignment of semiconductor chips in multi-chip optical devices and circuits, and for optically aligned multi-chip photonic integrated circuit devices that are easier to assemble and align.

SUMMARY

Accordingly, an aspect of the present disclosure is directed to a hybrid optically aligned semiconductor device integrating two or more semiconductor chips and a method of fabricating thereof wherein the semiconductor chips are optically aligned in at least one direction using one or more alignment surfaces serving as vertical alignment stops. The semiconductor chips with alignment surfaces abutting each other may then be bonded together using bonding pads that are vertically offset from the alignment surfaces. The alignment surfaces may be epitaxially-defined and abutting each other in the assembled hybrid device in the absence of bonding material therebetween.

An aspect of the present disclosure provides a method of fabricating an optically aligned hybrid semiconductor device, the method comprising:

a) providing a first semiconductor chip comprising a first alignment surface a and a first optical waveguide, wherein the first alignment surface is positioned with a first offset from an optical axis of the first optical waveguide;

b) providing a second semiconductor chip comprising a second alignment surface and a second optical waveguide wherein the second alignment surface is positioned with a second offset from an optical axis of the second optical waveguide wherein one of the first and second offsets is epitaxially defined in the respective first or second semiconductor chip to complement the other of the first and second offsets, so that when the first and second alignment surfaces are in contact abutting each other the first and second waveguides are aligned in a direction normal to the first and second alignment surfaces;

c) positioning first and second semiconductor chips with the first and second alignment surfaces facing each other; and, d) bringing the first and second semiconductor chips together until the first and second alignment surfaces come to a hard stop against each other, with the first and second alignment surfaces being in direct contact abutting each other and the first and second optical waveguides being optically coupled.

One aspect of the present disclosure provides an optically aligned hybrid semiconductor device comprising: a first semiconductor chip comprising a first alignment surface and a first optical waveguide having an optical axis, wherein the first alignment surface is positioned with a first offset from the optical axis of the first optical waveguide; and, a second semiconductor chip comprising a second alignment surface and a second optical waveguide having an optical axis, wherein the second alignment surface is positioned with a second offset from the optical axis of the second optical waveguide, wherein the second offset is complementary to the first offset; wherein at least one of the first and second alignment surfaces comprises an epitaxial surface; and, wherein the second semiconductor chip is disposed upon the first semiconductor chip so that the second alignment surface directly abuts the first alignment surface in a contact therewith, and the first and second optical waveguides are aligned and optically coupled.

One aspect of the present disclosure provides a method of fabricating an optically aligned hybrid semiconductor device, the method comprising:

a) obtaining a first semiconductor chip comprising a first alignment surface and a first optical waveguide, wherein the first alignment surface is positioned with a first offset from an optical axis of the first optical waveguide;

b) obtaining a second semiconductor chip comprising a second alignment surface and a second optical waveguide, wherein the second alignment surface is positioned with a second offset from an optical axis of the second optical waveguide, wherein the first and second offsets are complementary so that when the first and second alignment surfaces are in contact with each other, the first and second waveguides extend in a common plane;

wherein obtaining at least one of the first and second semiconductor chips includes using layer thickness-controlled epitaxy to grow a first stack of epitaxial layers so as to define a position of one of the first and second alignment surfaces in the first stack of epitaxial layers at a layer interface between two of the epitaxial layers or at a layer surface of a top epitaxial layer in the first stack;

c) aligning first and second semiconductor chips with the first and second alignment surfaces facing each other; and, d) bringing the first and second semiconductor chips together until the first and second alignment surfaces come to a stop against each other, with the first and second alignment surfaces being in direct contact abutting each other and the first and second optical waveguides being optically coupled.

According to an aspect of the present disclosure, the method may include growing the first stack of epitaxial layers that comprises a first waveguiding layer so as to cause the layer interface to be offset from an optical plane of the waveguiding layer by one of the first and second offsets. The method may further include selectively etching the first stack of epitaxial layers using a layer-selective etch so as to expose at least a portion of a surface of one of the epitaxial layers at the epitaxial layer interface, and using the exposed surface of said epitaxial layer as one of the first and second alignment surfaces.

In one aspect obtaining at least one of the first and second semiconductor chips may further include using thickness-controlled epitaxy to grow a second stack of epitaxial layers comprising a buffer layer disposed over a second waveguiding layer so as to cause the top surfaces of the buffer layer to be offset from an optical plane of the second waveguiding layer by the other one of the first or second offsets.

In accordance with an aspect of the present disclosure, the method may include providing each of the first and second semiconductor chips with a bonding pad, the bonding pads positioned so as to face each other with a gap therebetween when the first and second semiconductor chips are brought together in step (d) with the first and second alignment surfaces in direct contact abutting each other. The method may further include depositing a compliant bonding agent upon at least one of the bonding pads to a total height exceeding the gap. Step (d) may then comprise bringing the first and second semiconductor chips together to first cause the compliant electrically conducting bonding agent to touch the opposing bonding pad, and then bringing the first and second semiconductor chips further together until the first and second alignment surfaces come to a stop against each other while forcing the compliant bonding agent to partially expand sideways into a space between the first and second semiconductor chips. The method may further include causing the compliant bonding agent to solidify, thereby providing mechanical bonding between the first and second semiconductor chips. In some instances the bonding pads and the compliant bonding agent may be electrically conducting, and the bonding pads may be disposed on electrically conducting surfaces of the respective first or second semiconductor chips, so as to provide electrical connection between the first and second semiconductor chips in the optically aligned hybrid semiconductor device.

BRIEF DESCRIPTION OF THE DRAWINGS

Embodiments disclosed herein will be described in greater detail with reference to the accompanying drawings, which are not to scale and in which like elements are indicated with like reference numerals, and wherein.

DETAILED DESCRIPTION

Figure 1:
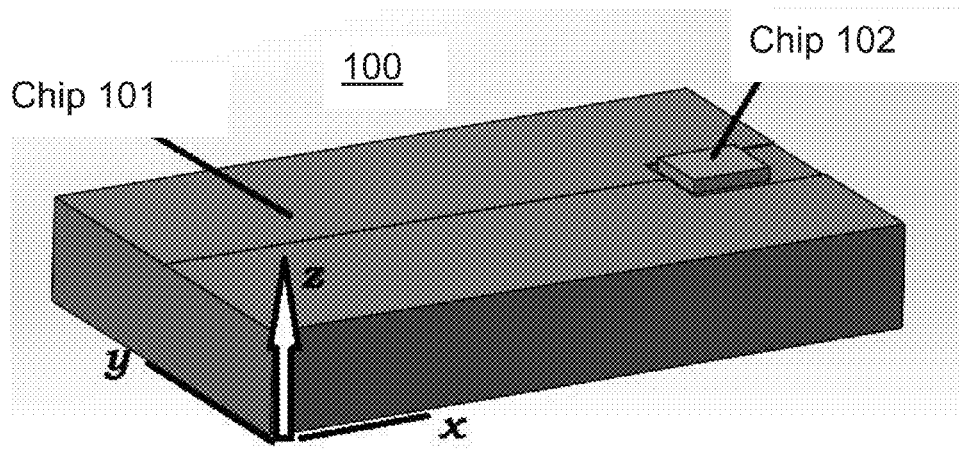
FIG. 1 is a schematic diagram representing a perspective view of a hybrid semiconductor device composed of two semiconductor chips with optically aligned waveguides.

In the following description, for purposes of explanation and not limitation, specific details are set forth, such as particular optical circuits, circuit components, techniques, etc. in order to provide a thorough understanding of the present invention. However, it will be apparent to one skilled in the art that the present invention may be practiced in other embodiments that depart from these specific details. In other instances, detailed descriptions of well-known methods, devices, and circuits are omitted so as not to obscure the description of the present invention. All statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Note that as used herein, the terms "first," "second" and so forth are not intended to imply sequential ordering, but rather are intended to distinguish one element from another, unless explicitly stated. Similarly, sequential ordering of method steps does not imply a sequential order of their execution, unless explicitly stated. The terms "obtaining" or "providing," when used herein with relation to a step or operation of a method or a process, are intended to mean making an element, object, or feature available for use in the method or process, and encompass designing, either fully or in part, fabricating, either fully or in part, or otherwise acquiring the object, element, or feature, including for example purchasing or obtaining from an external supplier. The terms 'photonic integrated circuit,' or PIC, and 'integrated lightwave circuit' may be used herein interchangeably. The term "optical waveguide" is used herein to refer to any optical element or structure that provides optical confinement in at least one dimension and wherein light of a target wavelength or wavelengths can propagate.

The term "planar optical waveguide" may refer to any optical waveguide that is provided on a substantially planar substrate, carrier, or layer. Examples of such waveguides include ridge waveguides, buried waveguides, semiconductor waveguides, silica-based waveguides, polymer waveguides, other high-index or low-index waveguides, and many other examples not explicitly set forth herein but nevertheless falling within the scope of inventive concepts disclosed and/or claimed herein. Examples of suitable substrates include, but are not limited to semiconductor substrates, crystalline substrates, silica or silica-based substrates, substrates based on other glasses, ceramic, metal, and others not explicitly set forth herein but nevertheless falling within the scope of inventive concepts disclosed and/or claimed herein. The term "vertical" is used herein in relation to a plane of an optical chip or a carrier and is usually the direction of the epitaxial growth of the chip; vertical direction means a direction that is perpendicular to a main face of the optical chip at which an optical waveguide is defined, and perpendicular to the plane of the optical waveguide. The vertical direction may also be referred to herein as the transverse direction. In embodiments having an alignment surface configured to work as an alignment stop when two chips are brought together during assembly, the vertical direction may be normal to the alignment surface. Structural elements of the optical chip may be described with reference to a Cartesian coordinate system (x,y,z) associated with the chip, wherein the z axis is directed in the vertical direction normally to the main face of the chip and along the direction of the epitaxial growth. The terms "vertically offset" and "vertically displaced" are used herein interchangeably to mean being distanced in a direction that is perpendicular to the alignment surface, or to the plane of the optical waveguide, i.e., the z-axis direction. The term "offset" as a noun is used herein to refer to vertical offset between two elements or layers of a chip, i.e., a displacement of one of the elements from the other along, or in projection on, the vertical direction normal to the layers of the chip. An offset may be positive or negative, depending on the order of the respective elements along a z-axis that is normal to the plane of the chip. The positive direction of z axis may be, for example, the direction from an alignment surface away from the chip. The term "epitaxially defined" is used herein to mean defined by and during the epitaxial growth of the chip layers. The terms "epitaxially defined offset" and "epitaxially defined displacement" are used herein to refer to a distance or offset between epitaxially defined features of a stack of semiconductor or dielectric layers that are grown using a layer thickness-controlled epitaxy, in a direction generally normal to the layers, for example in the direction of epitaxial growth. It may refer to an offset between an optical axis or plane of a waveguiding layer and a top or bottom surface of another epitaxial layer of the stack. The location of an optical plane or axis of a waveguiding layer in the layer stack may be accurately determined from known thicknesses and refractive indexes of the waveguiding layer and its cladding layers as known in the art. The optical plane of a waveguiding layer is understood herein as a plane within the waveguiding layer wherein the vertical profile of a main optical mode supported by the waveguiding layer has maximum; for a layer stack that is substantially optically symmetric with respect to the waveguiding layer, the optical plane is the median plane of the waveguiding layer, i.e., the plane in the waveguiding layer that divides the waveguiding layer in two vertically-stacked sub-layers of equal height. In some embodiments, the optical plane may be assumed to be the median plane of the waveguiding layer. An optical axis of a waveguide is understood to mean a line traced by a maximum intensity point of a main optical mode of the waveguide when both lateral and vertical confinement of the mode are taken into account. In a transversely symmetric or nearly-symmetric waveguide it corresponds to a central line thereof. In some embodiments, the optical axis may be assumed to be the centerline of the waveguide core. An optical plane of a waveguide is a plane comprising the optical axis of the waveguide and parallel to the plane of the chip and to the substrate. Two chips with optical waveguides defined therein are said to be optically aligned when their respective optical waveguides are mutually aligned so as to be optically coupled through their end-faces.

Example embodiments disclosed herein relate to fabrication of hybrid optical devices comprised of two or more optically aligned semiconductor chips, each of said chips fabricated by forming a stack of layers of different materials upon a planar substrate, and having at least one planar optical waveguide defined in it, for example using known lithographic techniques. Portions of the layer structure and/or layer thicknesses of at least one of the chips are epitaxially defined during the chip fabrication so that when one of the chips is placed upon the other in a specified manner, or both are placed on a same carrier in a specified manner, optical waveguides are vertically aligned so as to ensure efficient optical coupling between the waveguides.

In various embodiments disclosed herein the chips to be optically aligned may be bonded to one another, or to a third device or carrier, by a bondable material such as but not limited to a solder alloy or an epoxy.

In various example embodiments disclosed herein each of the chips includes an optical waveguide and an alignment surface that is configured to assist in the vertical alignment of the chips, so that when one of the chips is placed upon the other with the alignment surfaces in contact abutting each other, optical planes of the two chips are coincidental and optical axes of the waveguides of the two chips lie in the same (x,y) plane so that the optical waveguides can be made optically aligned by adjusting the position of one of the chips in the (x,y) plane without requiring any further adjustment in the vertical, or transverse, direction. Such alignment surfaces may also be referred to herein as vertical-alignment surfaces, alignment-stop surfaces, or as alignment stops. The vertical offset between the waveguide's optical axis and the alignment surface of at least one of the chips is preferably epitaxially defined, i.e., defined by means of, and during, a controlled epitaxial growth of one or more layers of the chip. The alignment surface may be, for example, a top surface or a bottom surface of an epitaxial layer, which may be termed alignment layer. Since epitaxial growth can be tightly controlled using techniques that are well-known in semiconductor manufacturing, the vertical displacement of offset of the epitaxially-defined alignment surface with respect to the optical axis of the optical waveguide formed in the same chip may be precisely controlled with an accuracy of better than +\−200 nm, and in many cases with accuracy about or better than +\−100 nm. In at least some embodiments, the semiconductor chips are fabricated so that the vertical offsets between the alignment surfaces and the optical axes of two chips to be aligned are equal in value with accuracy of at least +\−200 nm, or preferably with the accuracy within +\−100 nm. However the direction of the alignment surface offset may differ between the two chips when one of the chips is to be flip-chip mounted on top of the other. Offsets that are equal in value but different in direction or sign may be referred to herein as complementary.

In various embodiments disclosed herein the chips may have chemically stable, non-compressible, solid alignment surfaces engineered to be located at a known vertical offset from the optical axis of the chip. In some embodiments, the alignment surfaces are planar; in other embodiments they may be at least partially non-planar and configured to mate with each other. Preferably, the chemically stable alignment surfaces are non-reactive relative to the objects they contact in the assembled hybrid device. Preferably, the chemically stable alignment surfaces are surfaces of epitaxially grown semiconductor or dielectric layers and are absent of metal or any other material deposited by a non-epitaxial technique in which the thickness of the deposited material cannot be controlled with the desired accuracy. In some embodiments the alignment surface or surfaces may be provided by a surface of a layer that is formed using a layer growth technique that is non-epitaxial, but nevertheless allows for a layer thickness control with the desired accuracy, preferably so as to define relevant offsets in the structure within +\−200 nm from a target value, and more preferably within +\−100 nm.

Referring to FIG. 1, there is illustrated a perspective view of a representative hybrid semiconductor device 100 formed of a first semiconductor chip 101 and a second semiconductor chip 102, which may be referred to hereinafter simply as the first chip 101 and the second chip 102, respectively. The second semiconductor chip 102 is placed on top of the first semiconductor chip 101 and bonded thereto in an optically aligned fashion. The first chip 101 may be, for example, silicon-based, such as a SOI PIC chip, and the second chip 102 may be, for example, an InP or GaAs based chip. A silicon (Si) based optical chip may also be referred to herein as a SiP (silicon photonic) chip. The first chip 101 may also be referred to herein as the carrier chip. Also illustrated is a reference Cartesian coordinate system associated with the first chip 101 and having axes X, Y, and Z that may be used in the description. The chips 101 and 102 include optical waveguides formed therein which are optically aligned in the assembled hybrid device, and may further include electrical interconnects. Each of the chips 101, 102 also includes an alignment surface, with the alignment surface of at least one of the chips preferably being in the form of, or including, an epitaxial surface, i.e. a layer surface that is formed by epitaxy.

Figure 2:
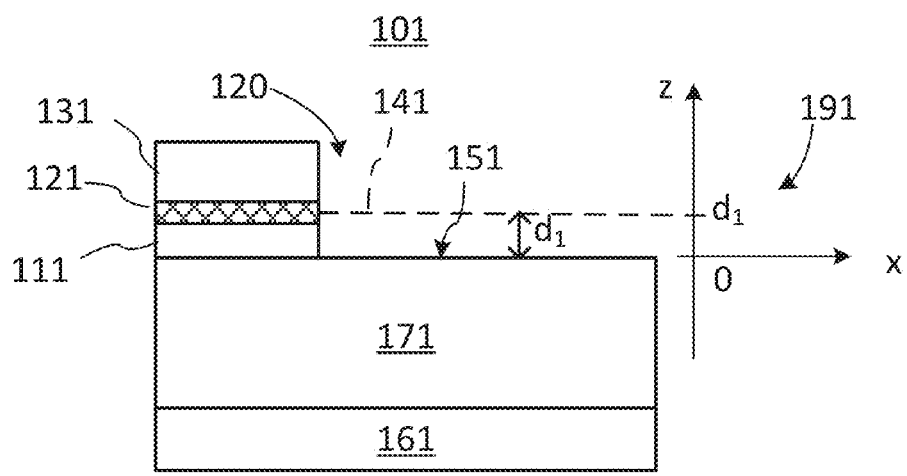
FIG. 2 is a schematic diagram illustrating a partial cross-section view of a first semiconductor chip showing an optical waveguide and a recessed alignment surface below the waveguide.
Figure 5:
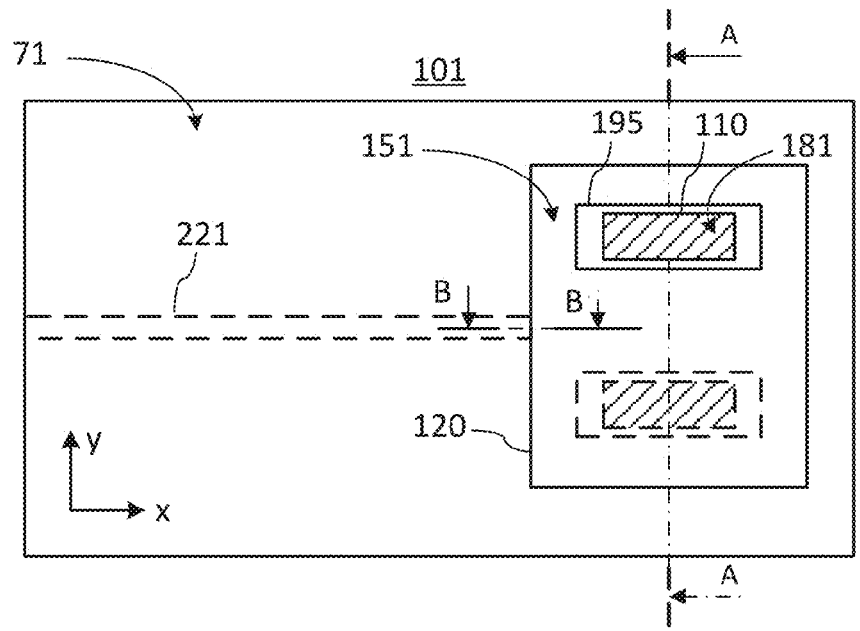
FIG. 5 is a schematic diagram illustrating a top plan view of an example embodiment of the first semiconductor chip showing the optical waveguide and a recessed alignment surface below the waveguide with further recessed contact pads.
Figure 6:
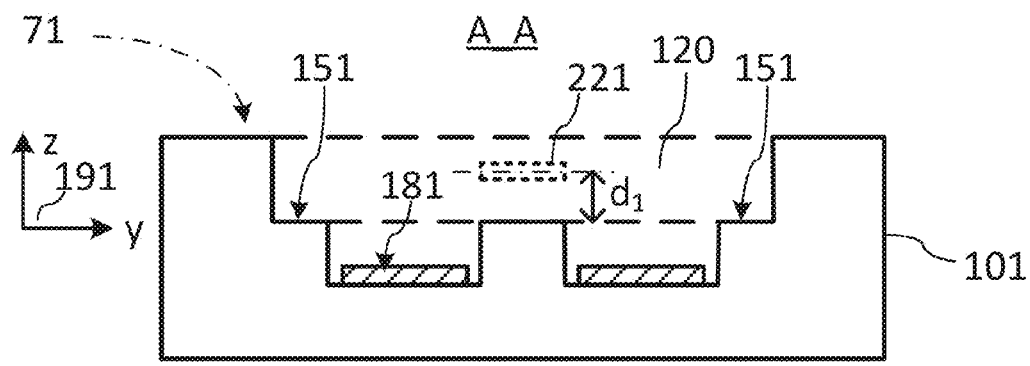
FIG. 6 is a schematic diagram representing a cross-sectional view through the recessed contact pads of the first semiconductor chip of FIG. 5.

FIG. 2 illustrates a schematic partial cross-section view of the first chip 101 in an example embodiment thereof, with the cross-section taken along the x-axis. The first chip 101 includes a waveguiding layer 121 forming a core of a first optical waveguide, such as the optical waveguide 221 indicated in FIG. 5, and a first vertical-alignment surface 151 that is positioned with a first vertical offset $d_1$ from an optical axis or plane 141 of the waveguiding layer 121, which is also referred to herein as the first offset 151. The first vertical-alignment surface 151 is useful for passive vertical alignment of the chips 101, 102 against each other as described hereinbelow, and may also be referred to herein as the first alignment-stop surface 151 or simply as the first alignment surface 151. In the illustrated embodiment the first alignment surface 151 and the first optical waveguide may be defined by an epitaxial growth of a stack of layers 171, 111, 121, and 131 on a substrate 161. The waveguiding layer 121 is sandwiched between cladding layers 111 and 131 of a lower refractive index. The waveguiding layer 121 defines the vertical position of the optical waveguide 221, an example of which is illustrated in FIGS. 5, 6, and as such defines the vertical position thereof in the chip. In a representative embodiment, the waveguiding layer 121 may have a thickness in the range of 300-800 nm, for example about 500 nm. The first alignment surface 151 may be an exposed portion of a top epitaxial surface of the alignment or buffer layer 171 wherein the cladding and waveguiding layers 111, 121, and 131 are removed by layer-selective etch to form a recess 120, or not grown. The exact vertical position of an optical axis 141 of the waveguide relative to the first alignment surface 151 depends on the refractive index profile of the epitaxial layer structure 111/121/131 in the vertical (z-axis) direction and may be accurately set by a controlled epitaxial growth as known in the art. The high layer-thickness accuracy afforded by the epitaxial growth enables to control the vertical offset $d_1$ with a high precision, typically with an accuracy of at least +\−200 nm or preferably within +\−100 nm.

The relative vertical positions of various elements of a chip may be described with reference to a Cartesian coordinate system associated with the chip, in which the z-axis is perpendicular to the plane of the chip and/or to the alignment surface and is directed away from the chip. The z-axis datum may, for example, be at the alignment surface. In FIG. 2 such coordinate system associated with the first chip 101 is indicated at 191; in the coordinate system 191 the vertical offset $d_1$ is positive, indicating that the waveguiding layer 121, and the corresponding optical waveguide 221, is positioned above the alignment surface 151 relative to the first chip.

Figure 3:
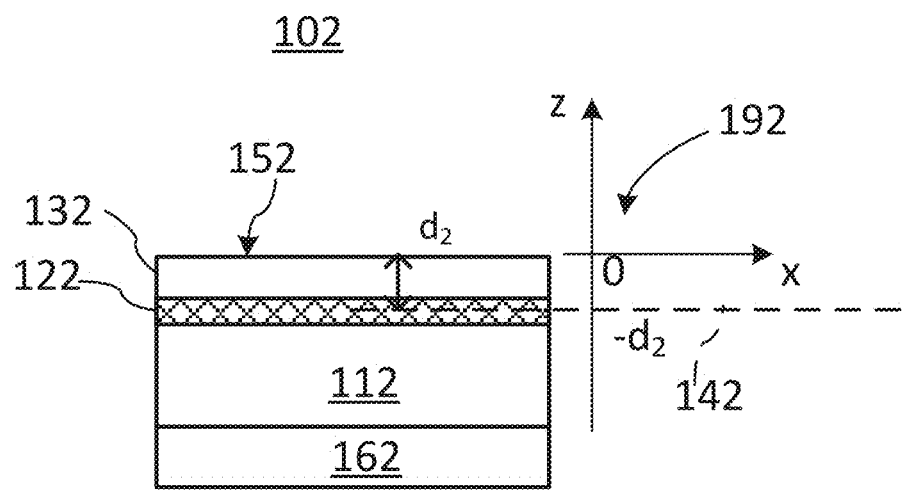
FIG. 3 is a schematic diagram illustrating a cross-section view of a second semiconductor chip showing an optical waveguide and an alignment surface above the waveguide.

FIG. 3 illustrates a schematic cross-sectional view of the second chip 102 in an example embodiment thereof. It includes a waveguiding layer 122 and a second vertical alignment surface 152 that is positioned with a second vertical offset $d_2$ from an optical axis or plane 142 of the waveguiding layer 122. The second vertical offset $d_2$ may also be referred to herein as the second offset $d_2$. In a representative embodiment, the waveguiding layer 122 may have a thickness in the range of 300-800 nm, for example about 500 nm. The second vertical-alignment surface 152, which will also be referred to herein simply as the second alignment surface 152, is useful for passive vertical alignment of the chips 101 and 102 when assembling the hybrid device 100 as described hereinbelow. In one embodiment, the second alignment surface 152 and the waveguiding layer 122 may be formed by growing a stack of layers 112, 122, and 132 on a substrate 162 using layer thickness controlled growth technique such as epitaxy, with the layers 112 and 132 defining the top and bottom claddings. The waveguiding layer 122 is sandwiched between cladding layers 112 and 132 of a lower refractive index, defining the vertical position of a core of an optical waveguide, such as an optical waveguide 222 illustrated in FIGS. 7-9. The second alignment surface 152 may be an exposed portion of a top surface of the top cladding layer 132, which serves in this case as an alignment layer. The vertical position of an optical axis 142 of the waveguide relative to the alignment surface 152 depends on the refractive index profile of the epitaxial layer structure 112/122/132 in the vertical, or z-axis, direction and may be accurately determined as known in the art from known layer thicknesses and refractive indexes. The high layer thickness accuracy afforded by the epitaxial growth enables to control the vertical offset $d_2$ with a high precision, typically about or better than +\−200 nm, or preferably within +\−100 nm.

Note that the second alignment surface 152 is vertically offset from the optical axis or plane 142 of the corresponding waveguide or waveguiding layer 122 in an opposite direction to the displacement of the alignment surface 151 relative to the waveguiding layer 121 in the first chip 101; while the first alignment surface 151 is positioned above the waveguiding layer 121 of the first chip 101, the second alignment surface 152 is positioned below the waveguiding layer 122 of the second chip 102. Here, the terms 'above' and 'below' refer to the face of the chip where the respective alignment surface is defined. In a coordinate system 192 associated with chip 102 wherein the z-axis is directed normally to the second alignment surface 152 away from the chip, the second vertical offset $d_2$ is negative.

Figure 4:
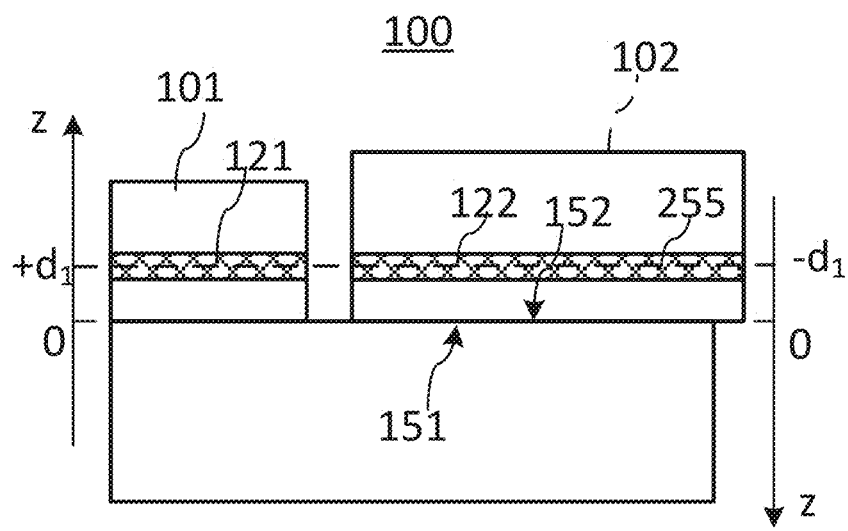
FIG. 4 is a schematic diagram illustrating a hybrid device composed of the first and second semiconductor chips with the alignment surfaces in contact resulting in optically aligned waveguides.

With reference to FIG. 4, in a preferred embodiment the first and second vertical offsets $d_1$ and $d_2$, at least one of which is epitaxially defined with a high precision during the fabrication of chips 101 and 102, are selected to be substantially equal in value, so that when chip 102 is placed on top of chip 101 with its alignment surface 152 facing the alignment surface 152 of the first chip 101 in a firm contact therewith, the optical waveguiding layers 121 and 122 are in a precise vertical alignment with each other, and extend in a common plane, which is indicated in FIG. 4 at 255 and may be generally parallel to the alignment surfaces. Offsets that are opposite in direction or sign but are equal in value, or have values that optimize optical coupling between the waveguides, such as the vertical offsets $d_1$, $d_2$ illustrated in FIGS. 2 and 3 and described hereinabove, may be referred to herein as complementary. Here "opposite in a direction or sign" means opposite relative to a datum feature of the chip for which the respective offset is defined. Once the chips 101 and 102 are brought together so that their alignment surfaces 151, 152 are in contact abutting each other, the relative position of the chips may be further adjusted as desired in the (x,y) plan so that the first and second optical waveguides are optically coupled with a desired coupling efficiency.

Thus, in one embodiment the method of fabricating an optically aligned hybrid device 100 may include the following general steps:

A) obtaining a first semiconductor chip, such as for example chip 101 illustrated in FIG. 2, with a first alignment surface 151 and a first optical waveguide defined therein, wherein the first alignment surface 151 is positioned with a first offset d1 from an optical axis of the first optical waveguide;

B) obtaining a second semiconductor chip, such as for example chip 101 illustrated in FIG. 2, with a second alignment surface 152 and a second optical waveguide defined therein, wherein the second alignment surface 152 is positioned with a second offset d2 from an optical axis of the second optical waveguide, wherein the first and second offsets d1, d2 are complementary so that when the first and second alignment surfaces 151, 152 are in contact with each other, the first and second waveguides extend in a common plane;

C) bringing the first and second semiconductor chips 101, 102 together until the first and second alignment surfaces 151, 152 come to a stop against each other, and remain in a direct contact abutting each other with the first and second optical waveguides being optically coupled in the assembled hybrid device.

In one embodiment, fabricating at least one of the first semiconductor chip 101 and second semiconductor chip 102 includes using thickness-controlled epitaxy to grow a first stack of epitaxial layers, such as the layer stack 171/111/112/131 of FIG. 2, or the layer stack 112/122/132 of FIG. 3 so as to define a position of one of the first and second alignment surfaces 151, 152 in the first stack of epitaxial layers at a layer interface between two of the epitaxial layers, such as the layer interface between layers 171 and 111 in FIG. 2, or at a layer surface of a top epitaxial layer in the first stack, such as the top layer surface of the top cladding epitaxial layer 132 in FIG. 3.

FIGS. 5 and 6 schematically illustrate a top plan view of an example embodiment of the first chip 101 in the absence of the second chip 102, and a plan sectional view of the first chip 101 taken along the line AA, respectively. FIG. 3 may be viewed as the partial cross-section B-B of the chip 101 as illustrated in FIG. 5. The optical waveguide 221 extends along the x-axis, and terminates at a recess or cavity 120 defined at the top face 71 of the first chip 101. The top face 71 of the first chip 101 may also be referred to as the main face of the chip, or as the chip-mounting face. A first alignment surface 151 at the bottom of the cavity or recess 120 is displaced from an optical axis of the waveguide 221 in the vertical direction (z-axis) by the first vertical offset $d_1$. The exact value of the first vertical offset may be epitaxially defined as described hereinabove. Bonding pad or pads 181 are in turn vertically offset from the first alignment surface 151 further away from the optical waveguide 221; in the shown embodiment they are disposed in recesses at the bottom of the cavity 120. The bonding pad or pads 181 are configured to adhere to a bonding agent for bonding to the second chip 102. In one embodiment, the bonding pad or pads 181 may be made of an electrically conducting material such as metal. In one embodiment, the bonding pad or pads 181 may serve as electrical contacts and may be referred to as electrode pads or as electrical contact pads.

Figure 7:
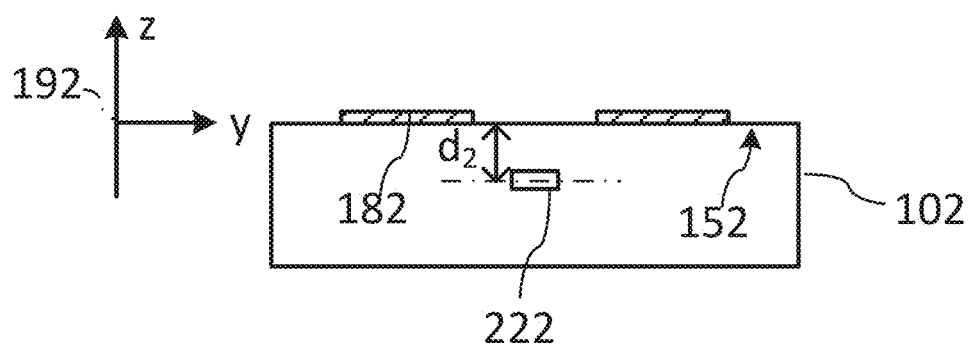
FIG. 7 is a schematic diagram illustrating a cross-section view of a second semiconductor chip with an optical waveguide, an alignment surface above the waveguide, and contact pads above the alignment surface.

FIG. 7 schematically illustrates a cross-sectional view of an example embodiment of the second chip 102 prior to mounting on the first chip 101 of FIGS. 5, 6. The second chip 102 includes a second optical waveguide 222 that terminates at an edge of the chip. A second alignment surface 152 is vertically displaced from the optical axis or plane of the second optical waveguide 222 by a second offset $d_2$. In one embodiment the second offset $d_2$ was epitaxially defined during the epitaxial growth of the second chip 102 to be substantially equal in value to the first vertical offset $d_1$ of the first chip 101, preferably with the accuracy of +\−200 nm or better, or more preferably with the accuracy of +\−100 nm or better. Electrical contact or bonding pads 182 may further be provided, for example leveled with the second alignment surface 152 or with a vertical offset therefrom. The bonding pads 182 may be disposed to mate with the bonding pads 181 of the first chip 101, as shown in FIGS. 8 and 9 and described hereinbelow.

Figure 8:
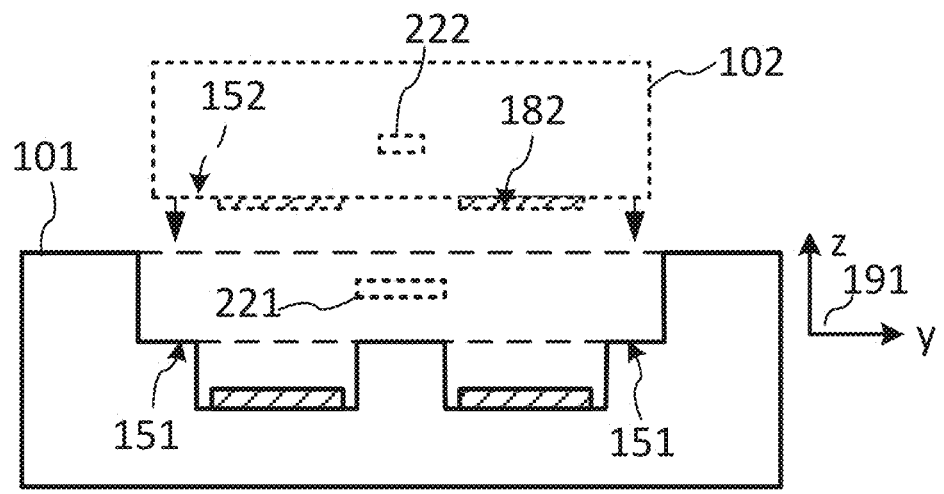
FIG. 8 is a schematic diagram of the first and second chips shown in FIGS. 6 and 7 in cross-sectional view during assembly, with the chips in very close proximity to each other, in a state of y-axis alignment, illustrating how salient features on each chip align.
Figure 9:
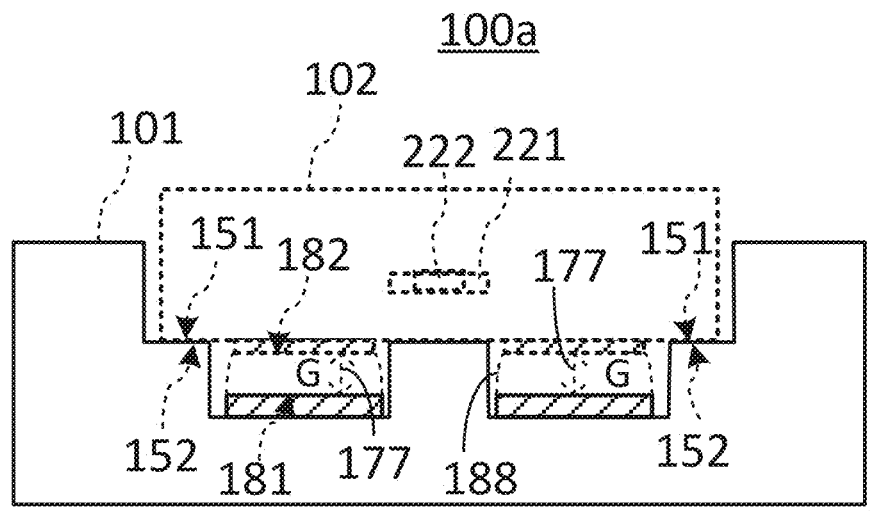
FIG. 9 is a schematic diagram representing a cross-sectional view of the assembled hybrid device with the first and second chips shown in FIGS. 6 and 7 optically aligned.

With reference to FIGS. 8 and 9, the second chip 102 may be flip-chip mounted in the recess formed in the main face of the first chip 101. The process of assembly of the optically aligned hybrid device may include aligning first and second semiconductor chips 101, 102 with the first and second alignment surfaces 151, 152 facing each other as illustrated in FIG. 8, and bringing the first and second semiconductor chips 101, 102 together until the first and second alignment surfaces 151 and 152 come to a stop against each other, with the alignment surface 151 abutting the alignment surface 152 as illustrated in FIG. 6. Since at least one and preferably both of the first and second distances $d_1$ and $d_2$ is epitaxially defined to match the other with a high degree of accuracy, in a relative chips position where the first and second alignment surfaces 151, 152 are parallel and in direct intimate contact with each other, the first and second optical waveguides 221, 222 are aligned in the vertical, i.e. z-axis, direction, so that their optical planes merge.

Advantageously, the precise vertical alignment of the chips may be accomplished passively without the need to monitor chip-to-chip optical transmission. During assembly, automated precision placing equipment used in this process may hold chip 102 in proper alignment position along the X and Y axes to chip 101 and in close proximity along the z axis, and then may move chip 102 along the Z axis to contact chip 101. In some embodiments, the passive alignment of the chips may be assisted by camera imaging. In some embodiments, the chips may be further optically alignment in the (x,y) plane using active alignment assisted by an optical feedback. In some embodiments, the alignment may be assisted by utilizing surface tension of a liquid bonding agent, such as melted solder, to move one of the chips in a position of optical alignment with the other chip.

In the illustrated embodiment the first electrical contact or bonding pad 181 is vertically displaced relative to the first alignment surface 151 in the z-axis direction away from the first optical waveguide 121, so that when the first and second alignment surfaces 151, 152 are brought in contact with each other there exists a gap G 177 between the first and second electrical contact or bonding pads 181 and 182. This contact gap may be filled with a bonding material 188, such as a compliant electrically conducting bonding agent, for example a solder or metal-filled epoxy, to bond the chips together and/or to provide an electrical connection between the pads 181 and 182. In one embodiment, the bonding pads 181 and 182 may be form of electrically conducting material, for example metal or metal alloy. In one embodiment, electrically conducting bonding pads 181 and 182 may be disposed upon surfaces of the first and second chips 101, 102 which are also electrically conducting, for example metallized or formed of a suitably doped semiconductor material, so as to provide electrical connections from the bonding pads to other areas of the respective chips.

In one embodiment, prior to bringing the chips together, the bonding agent 188, such as solder, may be disposed on one or both of the contact pads 181, 182 in an amount suitable for forming the electrical connection therebetween when the alignment surfaces 151 and 152 are in contact abutting each other. In some embodiments, it is sufficient if the bondable material 188 is present on one of the two chips that are to be aligned and bonded, as illustrated in FIG. 10.

Figure 10A:
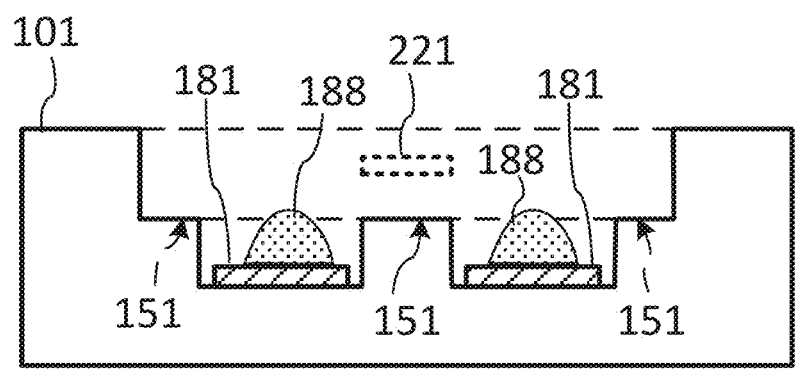
FIG. 10A is a schematic diagram representing a cross-sectional view of the first semiconductor chip of FIG. 5, with bonding agent disposed on the recessed contact pads prior to the assembly.
Figure 10B:
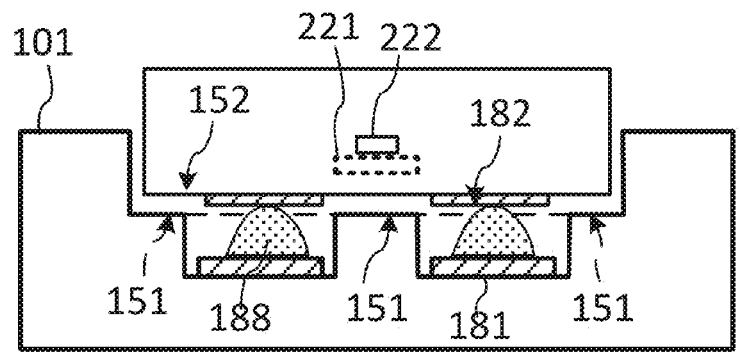
FIG. 10B is a schematic diagram representing a step in the assembly of the first and second semiconductor chips according to an embodiment of the assembly method.

With reference to FIGS. 10A and 10B, in one embodiment the bonding material 188 such as solder may be disposed on the bonding pad or pads to a total height that exceeds the contact gap G 177, and then made pliable during the assembly process to fill the gap 177, for example by heating. In this embodiment, as the two chips are brought into contact with each other, the bondable material 188 makes first contact with an opposing bonding pad, or solder disposed on the opposing solder pad, before any alignment surface can touch another alignment surface as is illustrated in FIG. 9. The assembly process then heats or otherwise provides impetus for the bonding material 188 to soften and form a conductive, for example metallic, or non-conductive adhesive bond between the two chips. As the bonding material 188 softens, the first and second semiconductor chips 101, 102 are brought further together until the first and second alignment surfaces 151, 152 come to a stop against each other while possibly forcing the bonding material 188 to partially expand sideways into a space between the first and second semiconductor chips.

In one embodiment the bonding agent 188 may be disposed upon one or both of the bonding pads 181, 182 to a total height that is less than the electrode gap G, but in the amount sufficient to fill the gap 177 so as to connect the bonding pads 181, 182 together. In this embodiment, the bonding material 188 may be made to gather up and fill the gap 177, for example by heating, after the alignment surfaces 181, 182 are brought into contact, so as to connect together the bonding pads 181, 182. In one embodiment, the bonding material 188 may be made to fill the gap 177 by wicking. In some embodiments, the bonding material in a liquid phase may be used to assist in the relative alignment of the chips by surface tension.

In one embodiment the bonding material 188 on chip 101, for example solder alloy, is caused to bond to the bonding pad of chip 101, for example by a rapid application of heat, pressure, and inert or reducing atmosphere. When the bonding material softens and melts and reflows onto the electrodes, chip 102 may be brought into more intimate contact with chip 101, with the alignment surfaces 152 of chip 102 coming to final rest upon the passive alignment surfaces 151 directly abutting each other. In this state optical planes or axes of the chips also become coincident, resulting in waveguide optical alignment. The devices are then cooled and the bonding material such as solder solidifies, permanently joining both chips to form a single compound hybrid device 100 with aligned waveguides.

In general, the bonding material 188 can be present during the chip assembly on the bonding pad or pads of either chip, as may be convenient. In embodiments where a plurality of chips are bonded one to another, a given chip may carry the bonding material for one bonding step, and may be lacking bonding material for a second bonding step if a bonding material is present on the other chip used in the second bonding step. In some embodiments, the bonding material is electrically conductive, such as solder or metal-filled epoxy. In other embodiments, the bonding material may be non-conductive, such as epoxy or adhesive.

Notably, in the hybrid optical device 100 or 100a the alignment surfaces 151 and 152 of the first and second chips 101, 102 function as vertical-alignment stops but are not used for boding; instead elements that are separate from the alignment surfaces 151, 152, namely the bonding pads 181, 182, are utilized to bond the chips together. This separation of the alignment-stop functions and boding function may be advantageous for accurate optical alignment of the chips, since the thickness of a bonding material between two surfaces being bonded in the final hybrid device is difficult to control with the sub-micron accuracy desired for the optical alignment between the waveguides. Furthermore, chemical reactions that may be associated with bonding, such as the reaction of solder to a metal of the bonding pad, may consume a significant depth of the bonding pad, thereby rendering its surface no longer at the target distance from its referenced optical plane or axis. A similar problem of surface deformation leading a to waveguide misalignment may also be present when two chips are bonded using textured cold welds, which may be used to bond a metallized surface having sharp projections to another metallized surface.

The alignment surfaces 151 and 152 that function as vertical-alignment stops may be epitaxially-defined and provided by the exposed surface of a top layer of a chip, or by a surface of one of the intermediate epitaxial layers of the chip, with the exact position of the alignment surface defined by the position of an epitaxial layer interface, that may be precisely controlled relative to the center of the waveguiding layer by layer-thickness controlled epitaxy with an accuracy of at least +\−200 nm, or +\−100 nm. An intermediate epitaxial layer that serves as an alignment layer may be at least partially exposed by layer-selective etching so that its exposed surface may serve as the alignment surface. The material of the alignment layer should preferably be selected to be highly resistant to the selected etching process, so that the alignment layer may function as an etch-stop layer.

In example embodiments described hereinbelow one of the chips of the hybrid semiconductor device 100, for example the first chip 101, may be silicon-based and may be referred to hereinafter the silicon photonic (SiP) chip. In some embodiments, the SiP chip can be built on a silicon-on-insulator (SOI) wafer that includes a silicon substrate, a buried oxide layer (BOX) and a silicon device layer. The SiP chip can include a number of passive and active components including grating and edge couplers, waveguides, splitters, modulators and germanium photodetectors. There can be metal interconnects for electrical routing on the SiP chip. The SiP chip can be fabricated in a CMOS-style process. Edge couplers can be formed in the SiP chip using the silicon device layer that exist on the SOI wafer and/or using additional layers that may be deposited during the device fabrication and processing. Optical waveguides can be formed in various layers of the SiP chip. Some of the layers may be planarized, for example using chemical-mechanical polishing (CMP). In some embodiments, the optical waveguide or waveguides formed in the SiP chip may utilizes silicon dioxide layers as cladding layers. In various embodiments, the thickness of the cladding layers can be finely tuned to ensure precise vertical, or Z-axis placement of the waveguiding layers.

Figure 11A:
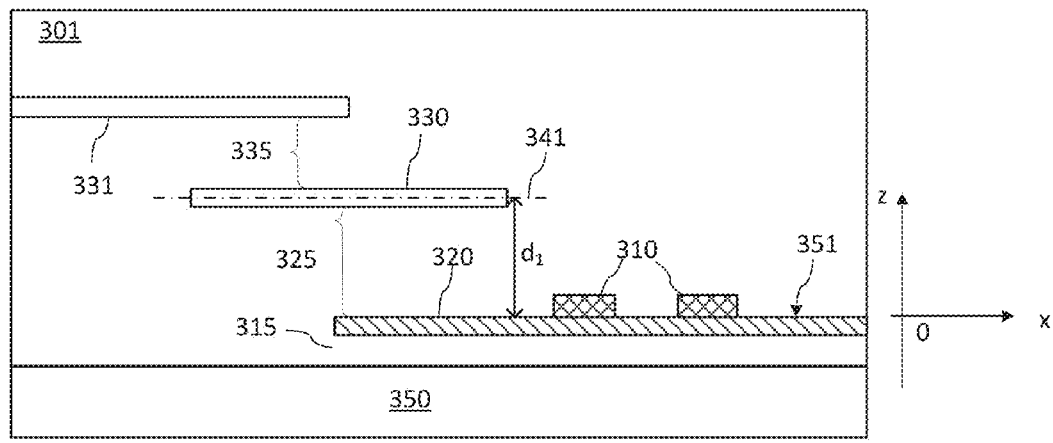
FIG. 11A is a schematic cross-sectional view of a first semiconductor chip with an etch-stop layer and metal pads over it prior to etching to expose an alignment surface.
Figure 11B:
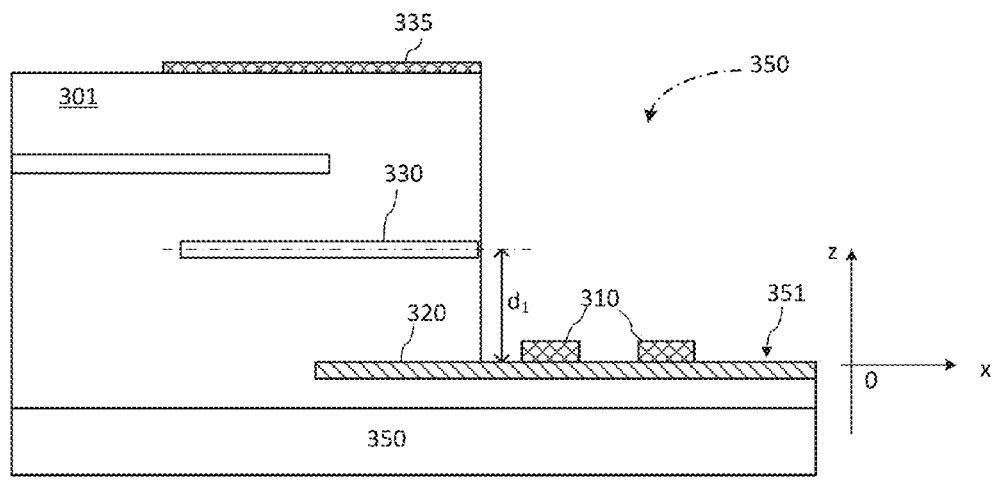
FIG. 11B is a schematic cross-sectional view of the first semiconductor chip with an etch-stop layer and an exposed alignment surface.

Referring to FIGS. 11A and 11B, there is illustrated a side cross-sectional view of an example SiP 301 chip at different stages of fabrication. The SiP chip 301 includes an optical waveguide 331 for edge-coupling to an optical fiber, an optical waveguide 330 for optically coupling to a second chip, an etch-stop layer 320, and a metal layer patterned for forming electrical contact or bonding pads 310, all supported by a silicon or SOI base substrate or handle 350. The SiP chip 301 as illustrated in FIG. 11A may be fabricated using a sequence of epitaxial or high-precision non-epitaxial growth steps, selective etching steps, selective metal deposition and re-growth. The fabrication process may include, for example, depositing a first cladding layer 315 over a Si or SOI substrate 350, followed by deposition or epitaxial growth of the etch-stop layer 320, the second cladding layer 325 as a third layer, a first waveguiding layer at the location of the optical waveguide 330, a third cladding layer 335, and a second waveguiding layer at the location of the optical waveguide 331. In some embodiments the optical waveguide 331 may be absent. The metal pads 310 may be formed upon the etch-stop layer 320 using known lithographic techniques prior to the growth of the second cladding layer 325. The etch-stop layer 320 may be used as the first alignment layer, with its top surface defining the vertical, or z-axis position relative to the waveguide 330 of the first alignment surface that will be used as a vertical alignment stop in a subsequent ship assembly. Accordingly, the deposition of the second cladding layer 325 and the first waveguiding layer defining the core of the first optical waveguide 330 may be performed in a controlled manner to ensure a desired value of the first vertical offset $d_1$ separating the optical axis or plane 341 of the first optical waveguide 330 from the top surface of the etch-stop layer 320. The layer structure indicated in FIG. 11A may be formed using wafer-scale fabrication.

The device structure illustrated in FIG. 11A may then be processed using a suitable selective etch technique to remove all of the layers up to the etch stop layer 320 in a portion of the chip, as defined for example by a hard mask 335. The selective etch step may result in a structure illustrated in FIG. 11B, wherein chip 301 now has a cavity or recess 350 that opens at the top face of the chip, with an exposed top surface 351 of the etch-stop layer 320 at the bottom of the cavity 350 forming the first alignment surface. Depending on the materials used, the selective etch technique may be, for example, a deep oxide etch or a suitable wet etch, with the material of the etch-stop layer 320 selected to be resilient to the etch.

By way of example, the cladding layers 315, 325 and 335 may be formed of silicon dioxide, the waveguiding layers 330, 331 may be formed of silicon, polysilicon, amorphous silicon, silicon dioxide, doped silicon, silicon nitride, germanium, or silicon germanium, while the etch stop layer 320 may be a layer of silicon dioxide or silicon nitride, and the reactive ion etch (RIE) technique may be used to remove the cladding and waveguiding layers in the selected portion of the chip.

Figure 12A:
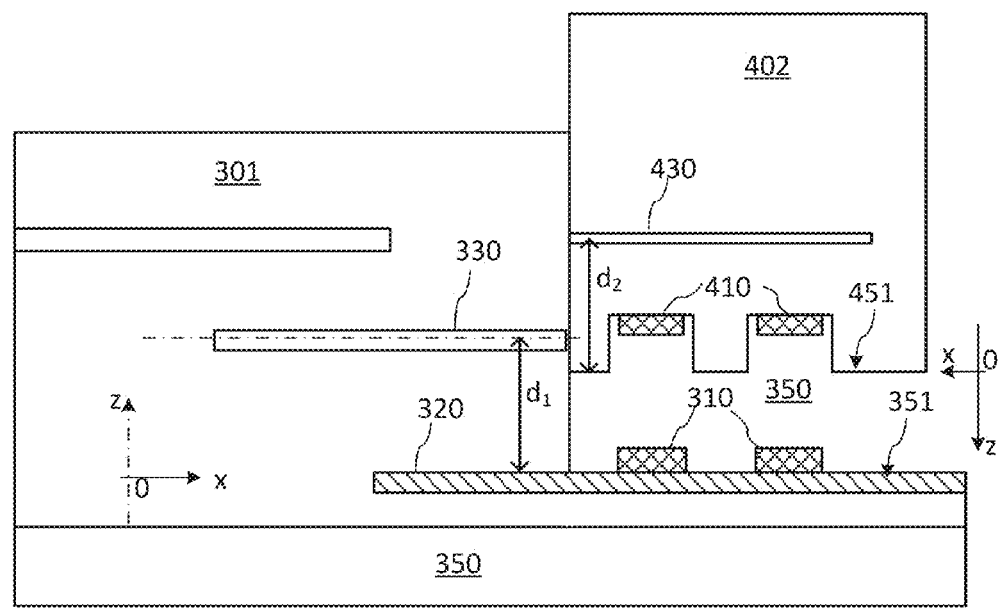
FIG. 12A is a schematic diagram illustrating the placement of a second semiconductor chip with matching contact pads into a recess in the first semiconductor chip.
Figure 12B:
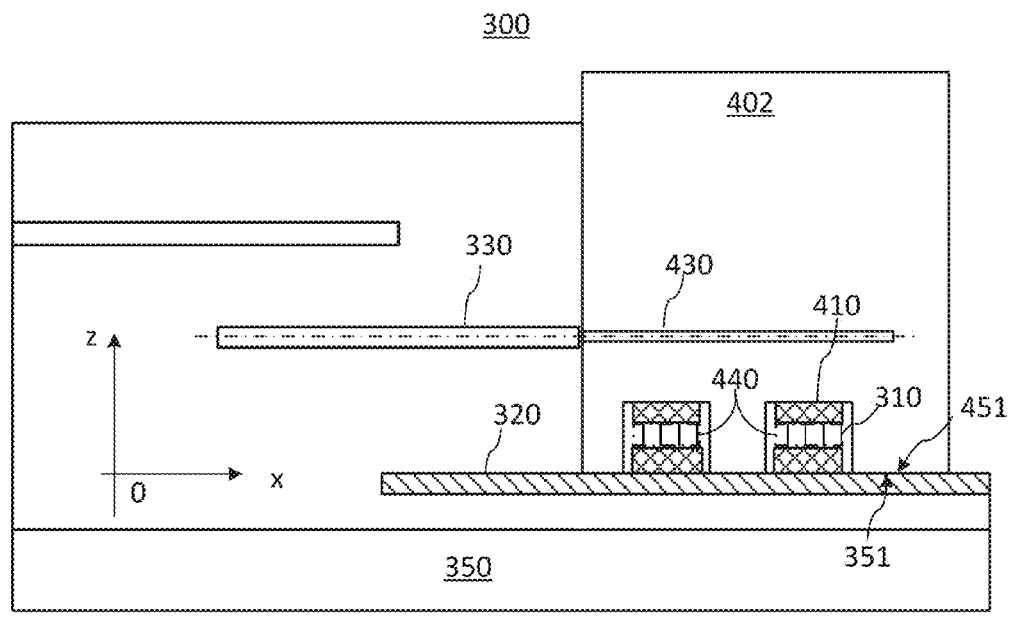
FIG. 12B is a schematic diagram of an assembled hybrid semiconductor device formed of optically aligned first and second semiconductor chips of FIG. 12A.

Turning now to FIGS. 12A and 12B, an optically-aligned hybrid semiconductor device may be fabricated by placing a second chip 402, for example an InP-based chip, into the cavity or recess 350 at the top of the first chip 301. The second chip 402 has a second alignment surface 451, and in the process of assembly may be flipped to be oriented with the second alignment surface 451 facing the first alignment surface 351 of the first chip 301 and parallel thereto. A metal contact pad or pads 410 may be disposed in recesses in the second alignment surface 451, to be vertically offset therefrom and in a location suitable for mating with the first contact pads 310 of the first chip 301 when their respective alignment surfaces 351, 451 abut each other. The second chip 402 further includes an optical waveguiding layer 430 forming a core of an optical waveguide which terminates at a side of the second chip and which will be referred to herein as the waveguide 430. The optical waveguiding layer or waveguide 430 is disposed so that its optical axis or plane is vertically offset from the alignment surface 451 by a second distance $d_2$, which is preferably epitaxially defined to be equal in value to the first vertical offset $d_1$, as discussed hereinabove, with an accuracy of at least +\-200 nm, and preferably +\-100 nm.

Accordingly, when the second chip 402 is placed upon the first chip 301 with their alignment surfaces 451 and 351 abutting each other and in a firm contact across flat portions thereof, the optical waveguide 330 and 430 of the chips are in a good optical alignment with each other, with their optical planes or optical axes substantially aligned and coincidental, as illustrated in FIG. 12B. If required, precision placement equipment may be used to further align the chips in the (x,y) plane relative to each other so as to further improve optical alignment and coupling between the chips' waveguides.

Referring further to FIG. 12B, in the illustrated embodiment of the assembled device 300 optical waveguides 330 and 430 are aligned in the vertical, i.e., z-axis, direction, and metal contacts 310 and 410 are in electrical communication provided by a conductive bonding agent 440, such as solder, which bonds the chips together and provides electrical contact between their metal bonding pads 310 and 410, thereby also providing a thermal contact between the chips. In one embodiment an electrical contact (not shown) for contacting an external circuit may be provided at the two-chip device 300, on either the first chip 301 or the second chip 402. If provided on the first chip 301, this contact can be made on the same metal layer as that used to contact the second chip 402, or a different metal layer.

Figure 13A:
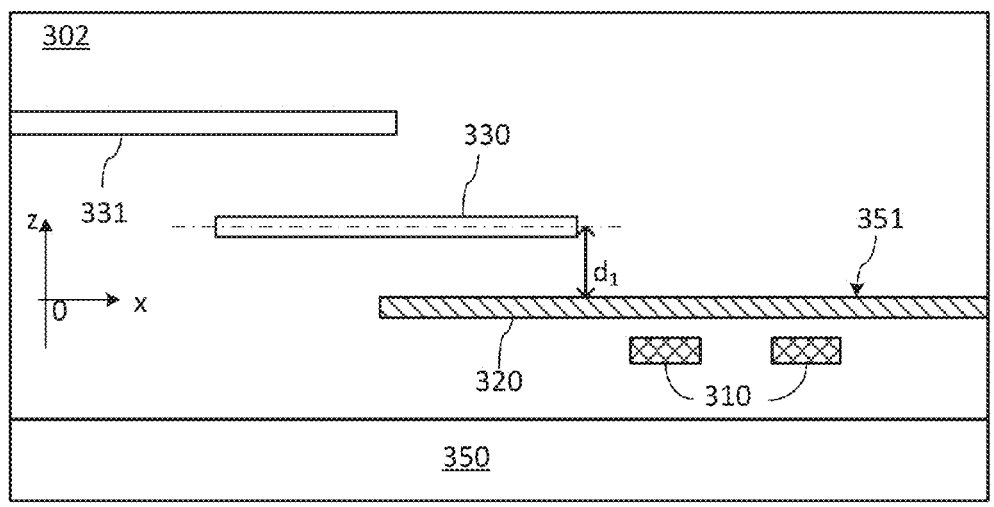
FIG. 13A is a schematic cross-sectional view of a first semiconductor chip with an etch-stop layer above recessed metal pads prior to etching to expose an alignment surface.
Figure 13B:
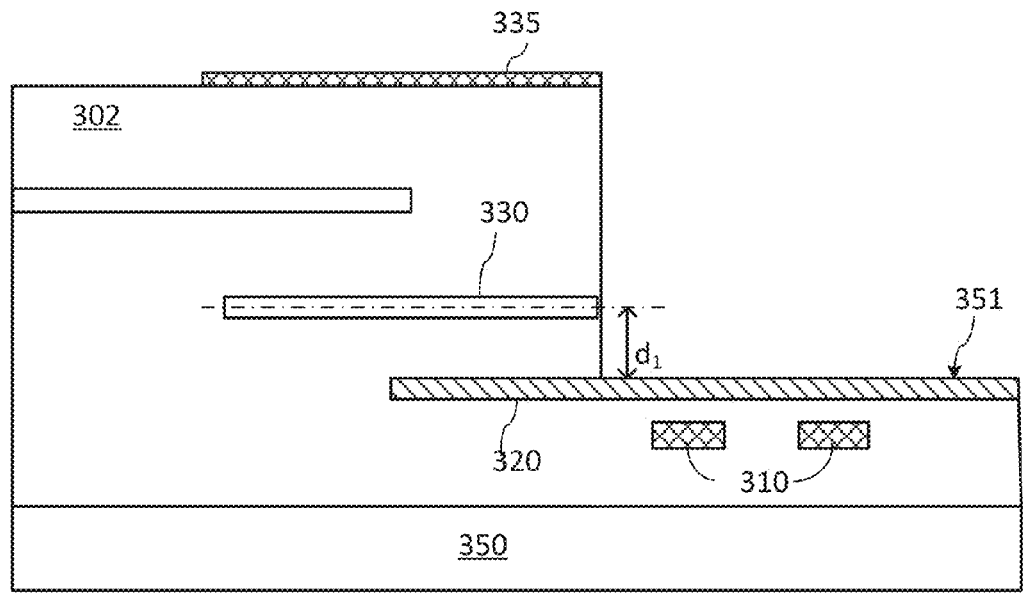
FIG. 13B is a schematic cross-sectional view of the first semiconductor chip of FIG. 13A after a first etch to expose the alignment surface.
Figure 13C:
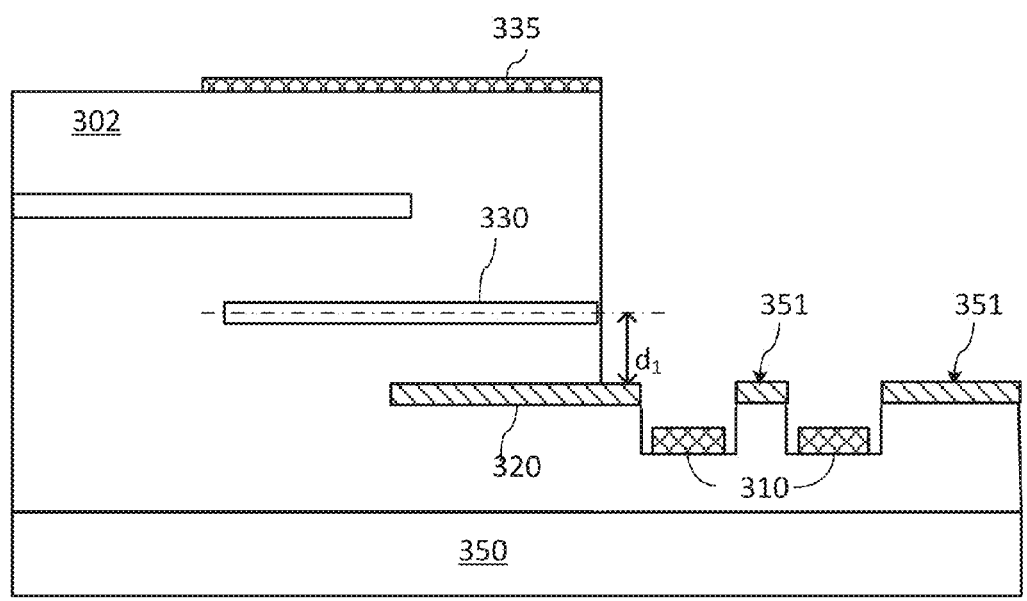
FIG. 13C is a schematic cross-sectional view of the first semiconductor chip of FIG. 13B after a second etch to expose the contact pads.

Referring now to FIGS. 13A-13C and FIG. 14, in another embodiment of the SiP chip that is generally indicated as chip 302, the etch-stop layer 320 may be deposited over the metal contact pad 310, possibly with an intermediate planarizing dielectric or semiconductor layer therebetween, so that the contact pads are vertically offset further away from the optical waveguide 330 than the top surface of the etch-stop alignment layer 320. As illustrated in FIG. 13A, the layer structure of the chip 302 may be in other respects similar to the layer structure of the chip 301 illustrated in FIG. 11A, with the etch stop layer 320 functioning as the first alignment layer. In one embodiment the waveguiding layer of the first waveguide 330 may be epitaxially grown over the etch stop alignment layer 320, with the offset $d_1$ between the optical plan or axis of the first waveguide or waveguiding layer 330 and the top surface of the etch-stop alignment layer 320 epitaxially defined to precisely complement the second offset d2 in a second chip. An etch to locally expose a portion of the top surface of the etch-stop alignment layer 320 may be performed in a manner similar to that described hereinabove with reference to FIGS. 11A and 11B, resulting in a structure illustrated in FIG. 11B, with the now-exposed portion of the top surface of the etch-stop layer 320 serving as the first alignment surface 351. A second selective etch may then be performed locally through the etch-stop layer 320 to expose the metal bonding pads 310, leaving substantial portions of the etch stop layer 320 unaffected to provide the first alignment surface 351 as a vertical-alignment stop for the second chip, as illustrated in FIG. 13C.

Figure 14:
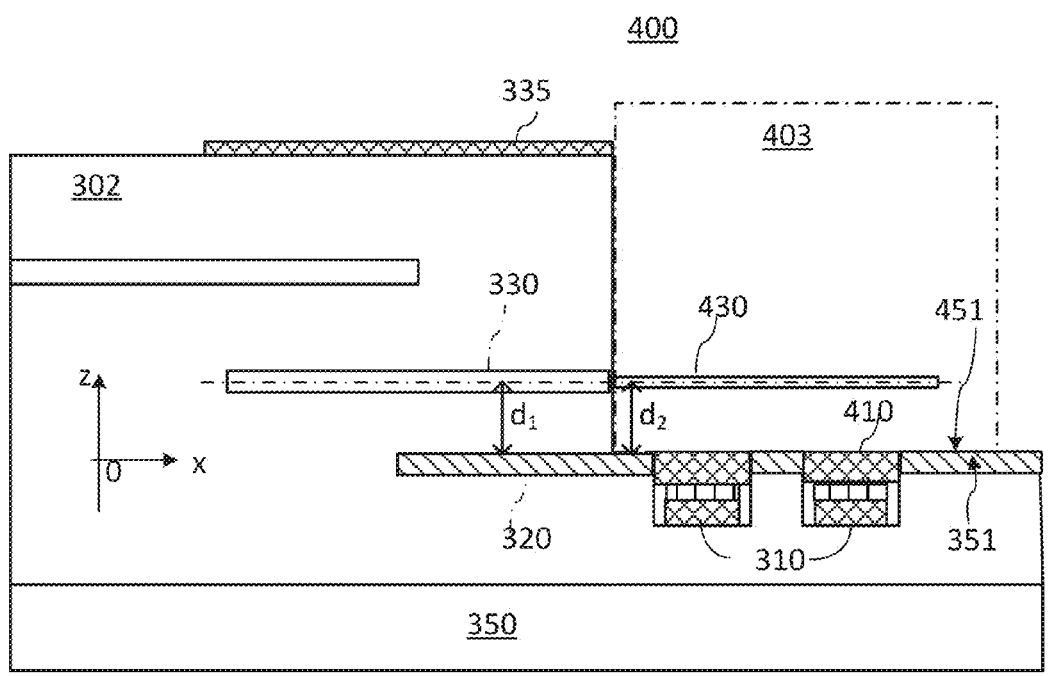
FIG. 14 is a schematic cross-sectional view of an embodiment of an assembled hybrid semiconductor device formed of the first semiconductor chip of FIG. 13C and a second semiconductor chip that is optically aligned with the first semiconductor chip and bonded thereto at mated contact pads.

FIG. 14 illustrates a hybrid semiconductor device 400 with a second chip 403 flip-chip bonded to the first chip 302, in a manner similar to that described hereinabove with reference to FIGS. 12A and 12B. Similar to chip 402, in the process of assembly is flipped to be oriented with the second alignment surface 451 facing the first alignment surface 351 of the first chip 302 and preferably parallel thereto. Metal contact pad or pads 410 may be disposed upon the second alignment surface 451 in a location suitable for mating with the first contact pads 310 of the first chip 301. The optical waveguiding layer or waveguide 430 of the second chip 403 is disposed so that its optical axis or plane is vertically offset from the alignment surface 451 by a second offset $d_2$, which may also be epitaxially defined to be equal in value to the first offset $d_1$ in the first chip 302, as discussed hereinabove, with an accuracy of at least +\−200 nm, and preferably +\−100 nm. Accordingly, when the second chip 403 is placed upon the first chip 302 with their alignment surfaces 451 and 351 abutting each other and in a firm contact across flat portions thereof, the optical waveguides 330 and 430 of the chips are in a good vertical alignment with each other, and their optical planes and/or axes substantially coincidental.

With reference to FIG. 14, in the illustrated embodiment of the assembled hybrid device 400 the optical waveguides 330 and 430 are aligned in the vertical, i.e., z-axis, direction, and metal contacts 310 and 410 are in electrical communication provided by a conductive bonding agent, such as solder, which bonds the chips together and provides electrical and thermal contact between their metal pads 310 and 410. If required, precision placement equipment may be used to further align the chips in the (x,y) plane prior to the bonding so as to ensure good optical alignment and optical coupling between the chips' waveguides.

Figure 15:
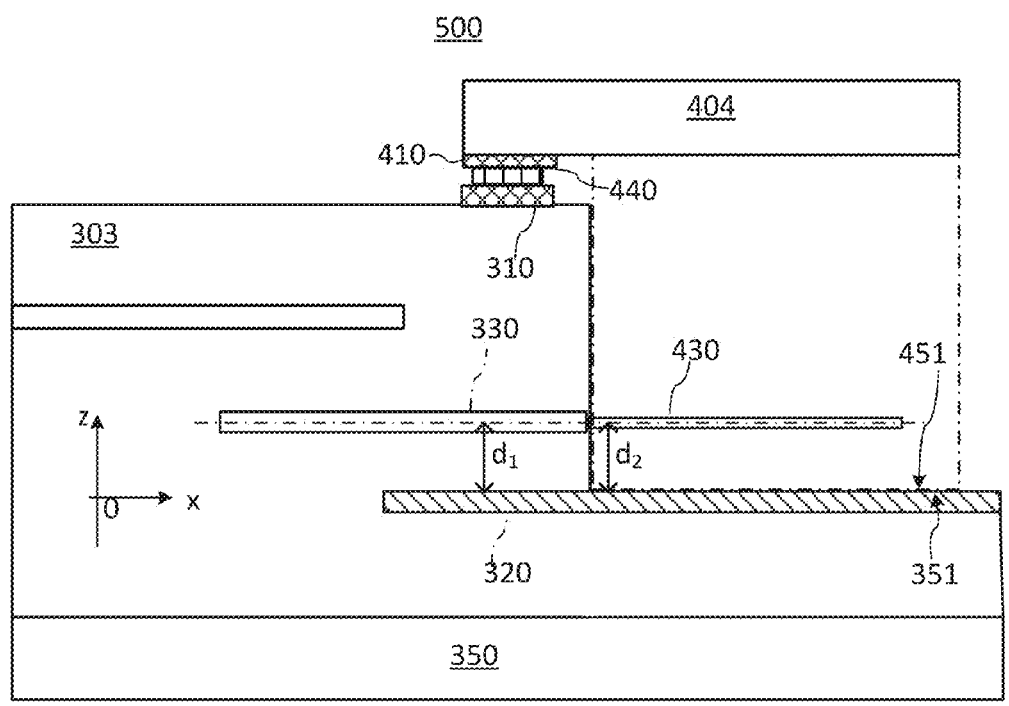
FIG. 15 is schematic cross-sectional view of an assembled hybrid semiconductor device formed of two semiconductor chip that are optically aligned using epitaxially-defined vertical-alignment stops and bonding pads located away from alignment surfaces.

With reference to FIG. 15, in another embodiment a hybrid semiconductor device 500 includes first and second chips 303 and 404, respectively, that are optically aligned and bonded together. The first and second chips 303 and 404 may be generally similar to the first and second chips 301, 402 illustrated in FIGS. 11 and 12, except that their respective contact pads 310 and 410 are both located with a vertical offset and away from the respective alignment surfaces 351, 451. As in the embodiments described hereinabove, the vertical offsets of the contact pads 310, 410 from the respective alignment surfaces 351, 451 differ so that when the alignment surfaces 351, 451 are parallel and in a direct contact with each other, the contact pads 310, 410 are separated by a gap, which in the assembled device may be filled by a bonding agent, for example solder, so as to provide mechanical bonding of the chips and, if desired, electrical and/or thermal contact between the chips.

The accurate vertical alignment of chips using vertical alignment stops in the form of alignment surfaces located at precise complementary offsets relative to respective optical waveguides that may be epitaxially-defined in each, or at least one, of the chips in accordance with the present disclosure may be accomplished in a variety of ways. In some embodiments the alignment surface of one of the chips may be provided by a top surface or surfaces of one or more pillars formed on the main face of the chip, while the alignment surface of the other chip may be provided in a recess or a trench that may be shaped to accept the pillar or pillars. In some embodiments one of the alignment surfaces may be provided as a surface of a buffer, or alignment, layer that may be epitaxially grown above or below of the waveguide cladding layers. In some embodiments the buffer layer may be selectively etched to form one or more pillars. In some embodiments one of the alignment surfaces may be provided by an exposed surface of a waveguiding layer or of a cladding layer. Several illustrative configurations will now be described with reference to exemplary embodiments wherein the first chip is a silicon-based chip and the second chip is a compound semiconductor laser chip. In other embodiments the first and second chips being integrated into a single hybrid device can be chips of other types or of the same type, for example both may be silicon-based, with each chip having at least one optical waveguide that is to be aligned to an optical waveguide of the other chip.

Figure 16A:
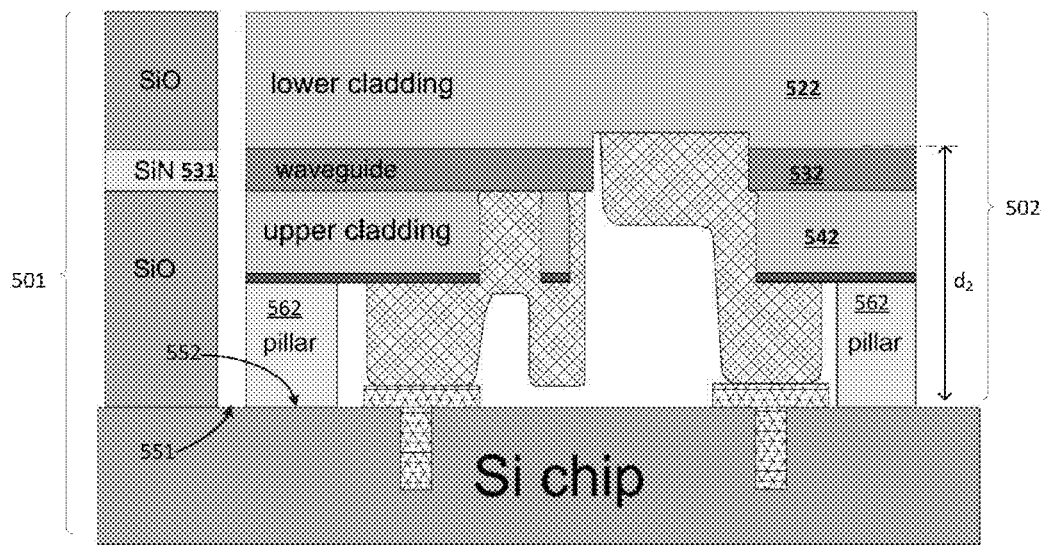
FIG. 16A is a schematic diagram showing a vertical cross-section of an assembled hybrid semiconductor device with alignment surfaces defined by pillars in a second chip and trenches in a first chip.

Referring to FIG. 16A, there is illustrated an example embodiment of a hybrid semiconductor device wherein the second chip 502, having an optical waveguide which core is defined by a waveguiding layer 532 sandwiched between cladding layers 522, 542, is flip-chip mounted on the first chip 501 having an optical waveguide defined by a waveguiding layer 531 sandwiched between cladding layers. The second chip 502 has pillars 562 with epitaxially-defined flat end-faces 552 defining the alignment surface of the chip, which may be referred to herein as the second alignment surface 552, and which is vertically displaced from an optical plane of the waveguiding layer 532 by an offset $d_2$. The second alignment surface 552 is abutting a first alignment surface 551 of the first chip 501. The first alignment surface 551 of the first chip 501 is disposed in a recess or trench formed in the top face of the first chip 501 to be positioned at vertical offset $d_1$ from an optical axis of the optical waveguide 531 of the first chip. The second optical offset $d_2$ may be epitaxially-defined to precisely complement the first vertical offset $d_1$, so as to result in the vertical alignment of the waveguides 531, 532 of the chips.

Figure 16B:
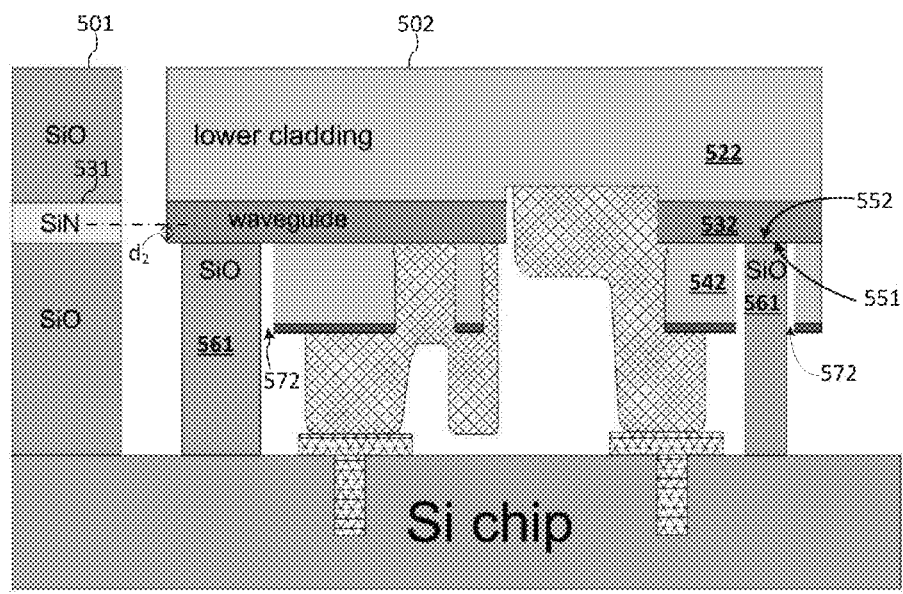
FIG. 16B is a schematic diagram showing a vertical cross-section of an assembled hybrid semiconductor device with alignment surfaces defined by pillars in a first chip and trenches in a second chip.

Referring to FIG. 16B, there is illustrated another example embodiment of a hybrid semiconductor device wherein pillars 561 are provided on the top face of the first chip 501, with flat end-faces of the pillars 561 defining the first alignment surface 551 of the first chip 501. The second alignment surface 552 is provided by areas of the top surface of the waveguiding layer 532 that are exposed in recesses or trenches 572 at the top face of the second chip. In the assembled device the second alignment surface 552 is abutting the first alignment surface 551 of the first chip 501, which is disposed with a precise vertical offset $d_1 = -d_2$ from an optical axis of the optical waveguide 531 of the first chip, ensuring precise vertical alignment of the waveguides 531, 532 of the chips.

Figure 16C:
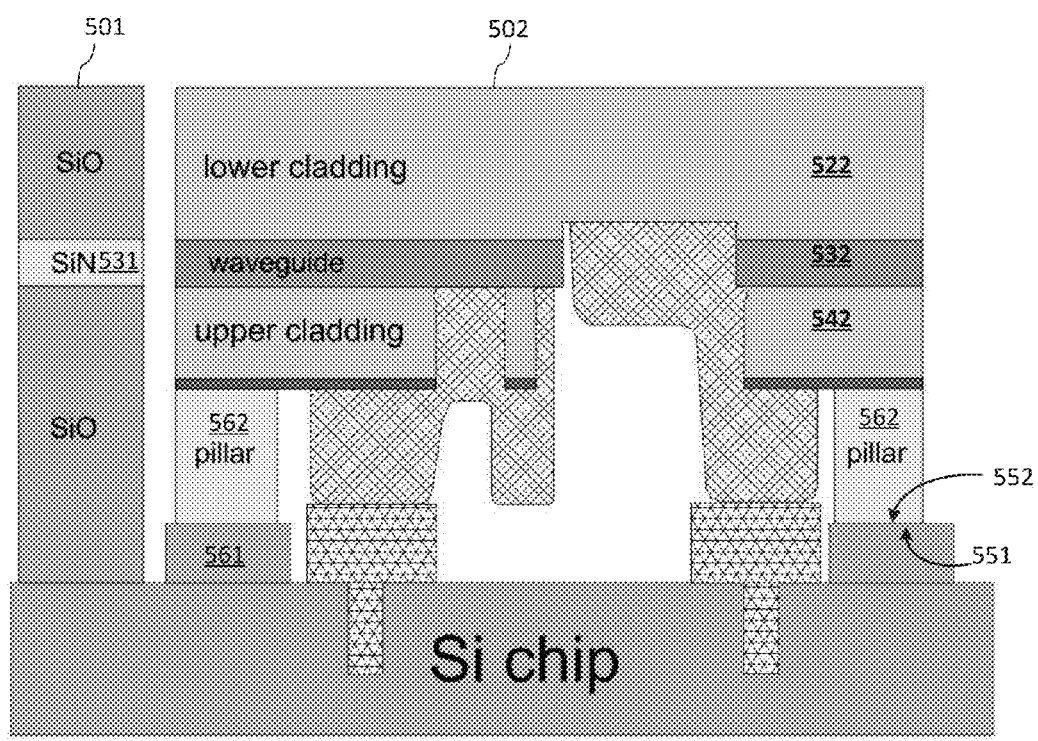
FIG. 16C is a schematic diagram showing a vertical cross-section of an assembled hybrid semiconductor device with alignment surfaces defined by pillars in both first and second chips.

Referring to FIG. 16C, there is illustrated an example embodiment of a hybrid semiconductor device wherein pillars 561, 562 are provided on the top faces of each, with flat end-faces of the pillars 561, 562 defining the first alignment surface 551 of the first chip 501 and the second alignment surface of the second chip 502, respectively. Pillars 561 may be formed in a recess defined in a top face of the first chip 501. The flat tops of at least one of the pillars 561 and 562 may be epitaxially defined.

Figure 17A:
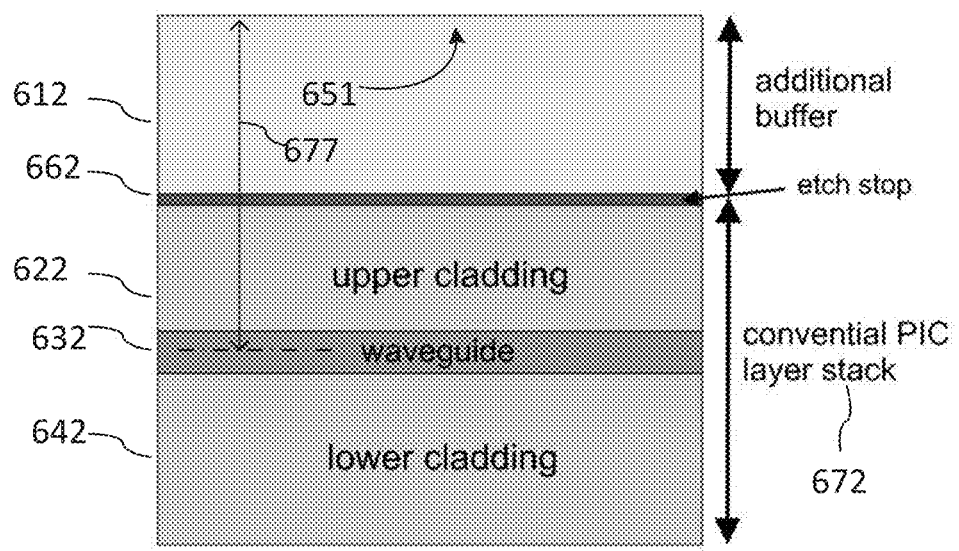
FIG. 17A is a schematic cross-sectional view of a semiconductor chip with an alignment surface provided by a buffer layer grown over a waveguiding layer stack.
Figure 17B:
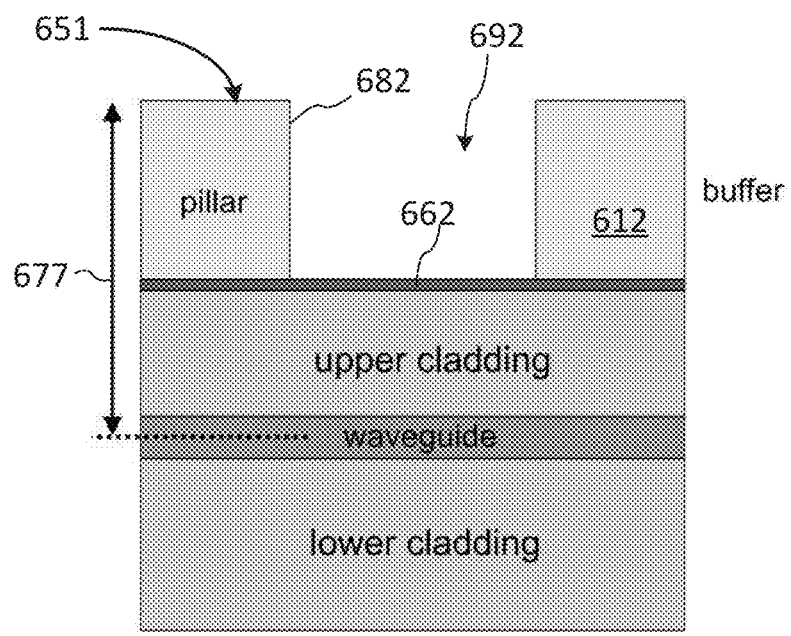
FIG. 17B is a schematic cross-sectional view of a semiconductor chip with an alignment surface provided by a pillars defined in a buffer layer grown over a waveguiding layer stack.

With reference to FIGS. 17A and 17B, in some embodiments one of the semiconductor chips may be fabricated by epitaxially depositing a buffer or alignment layer 612 of a suitable material over a layer stack 672 defining a planar optical waveguide in conventional photonic integrated circuit (PIC) or optical gain chips, so as to cause the top surface of the buffer layer 612 to be offset from an optical plane of the second waveguiding layer by the desired vertical offset, e.g., $d_1$ or $d_2$. As illustrated in FIG. 17A, this layer stack includes a waveguiding layer 632 sandwiched between two cladding layers 642 and 622, with the lower cladding layer 642 typically grown over a planar substrate (not shown). The buffer or alignment layer 612 may then be deposited over the upper cladding 622, with an optional etch-stop layer therebetween. The epitaxial growth of the layer stack 632/622/662/612 may be precisely controlled to provide a desired vertical offset $d_1$ 677 between the optical plane or axis of the waveguiding layer 632 and the upper surface 651 of the buffer layer 612, which may serve as the alignment layer for providing a vertical alignment stop during the hybrid device assembly. As described hereinabove, this vertical offset should match a complementary vertical alignment offset in another chip to be optically aligned with the chip illustrated in FIGS. 17A, B. Referring to FIG. 17B, in one embodiment a recess 692 may the selectively etched in the buffer or alignment layer 612 so as to form pillar or pillars 682 having epitaxially-defined flat tops; the non-etched top surfaces of the pillar or pillars 682 may serve as the alignment surface 651. In some embodiments, the buffer or alignment layer 612 may itself be multi-layer.

The entire layer stack may be fabricated by any suitable method of thickness-controlled epitaxial growth, in which a conventional layer stack of a PIC is grown with an additional buffer or alignment layer on top. The additional buffer or alignment layer is preferably deposited in the same epitaxial process step as the conventional layer stack, and can be composed of one material or of any number of different materials from the same material system.

The layer stack may also be fabricated in a multistep approach where the conventional layers stack 672 is formed in one process step such as but not limited to epitaxial growth, and the additional buffer or alignment layer or layers are formed in a second process step using the same material system or a different material system. The buffer or alignment layer or layers may be applied using various methods, such as but not limited to epitaxial growth, evaporative or sputter deposition, which preferably allow for a precise layer thickness control.

The layer and substrate materials can be chosen to allow selective etching that selectively removes certain material or materials and stops at a specific epitaxially defined layer with nanometer (nm) precision. Various techniques of selective etch known in the art of semiconductor processing may be used, with the etching typically stopping at an etch-stop layer of a material that is known to be highly resistant to the selected etch. The etch-stop techniques may have nm and even sub-nm height resolution. The uniformity of the pillar structures across a wafer may depend on the growth uniformity thickness across the wafer. For material selective etching, the height uniformity will be defined by the epitaxial growth uniformity. For other etching techniques that are not material selective, for example a dry ion etch, timing and monitoring may be used to define the height of the pillars, and could vary more across the wafer. Therefore layer selective etch techniques may be preferred. However, the methods and devices described in the present disclosure are not limited to using material-selective etch techniques and etch-stop layers, as other etches may provide improved resolution and across-wafer uniformity in time with improved processing equipment and techniques.

Figure 18A:
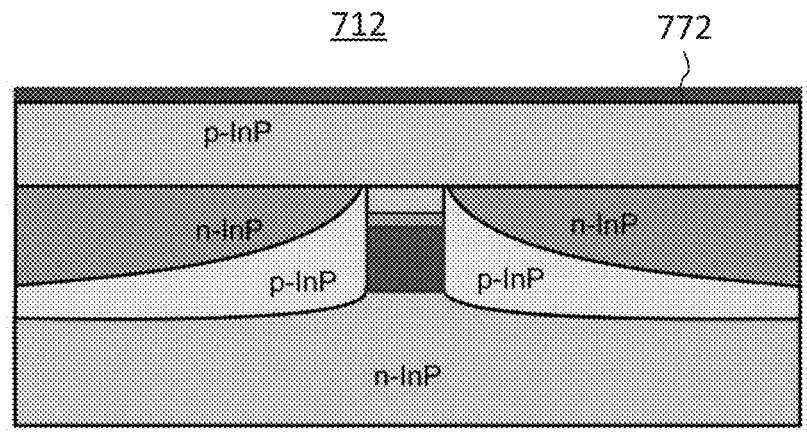
FIG. 18A is a schematic cross-sectional view of an InP-based laser diode chip with a buried heterostructure (BH) waveguide.
Figure 18B:
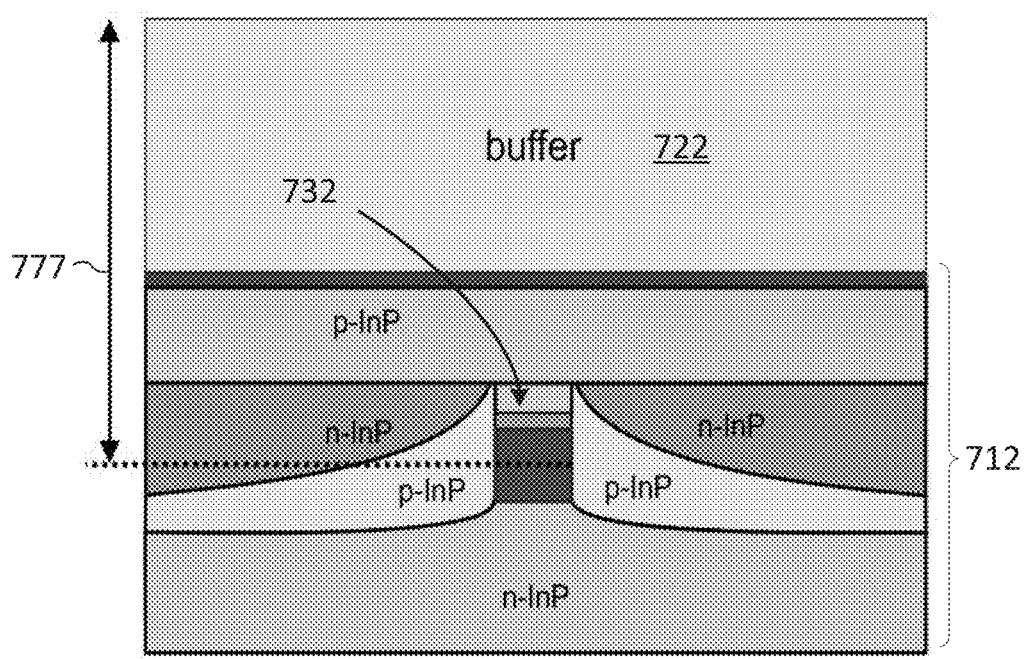
FIG. 18B is a schematic cross-sectional view of an InP-based laser diode chip with a BH waveguide and an alignment surface provided by a buffer layer grown over the BH layer structure.
Figure 18C:
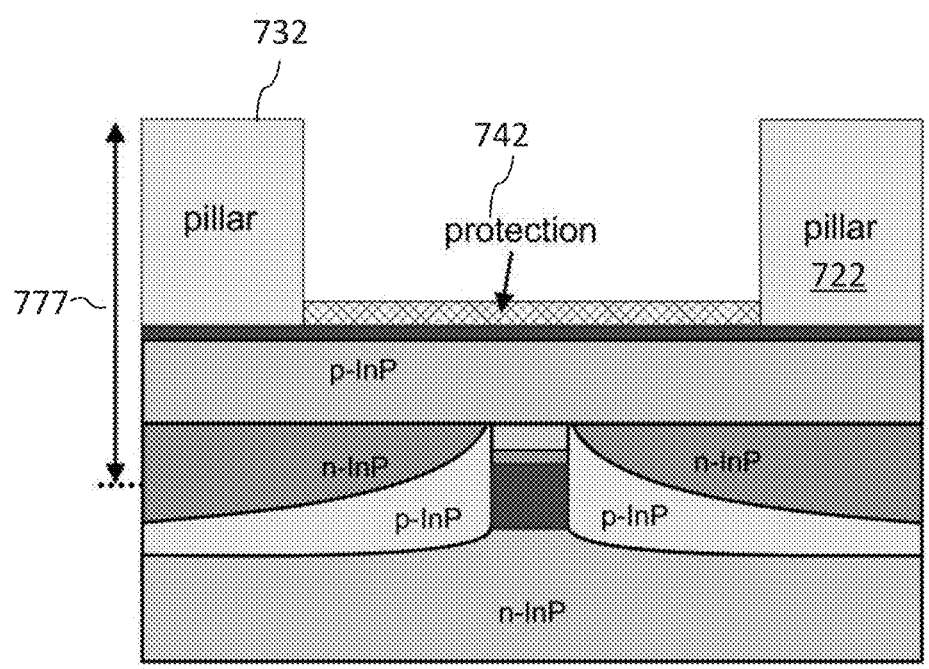
FIG. 18C is a schematic cross-sectional view of an InP-based laser diode chip with a BH waveguide and an alignment surface provided by pillars defined in a buffer layer grown over the BH layer structure.

Referring now to FIGS. 18A-18C, in one embodiment the second chip may be a semiconductor laser chip to be optically coupled to a silicon (Si) based PIC by mounting thereon and aligning the laser waveguide with an optical waveguide of the Si-based PIC chip. FIG. 18A illustrates by way of example a cross-sectional view of a layer structure 712 of a buried heterosotructure (BH) laser diode formed on an InP substrate; the illustrated BH layer and device structure is well known in the art and will not be described herein in further detail. In accordance with an embodiment of the present disclosure, an additional buffer or alignment layer 722 of a precisely-defined thickness may then be deposited, for example using epitaxial growth, over a capping layer 772 of the BH laser structure 712, as illustrated in FIG. 18B. The epitaxial growth of the buffer alignment layer 722 is height-controlled to provide a desired vertical offset $d_2$ 777 between an optical axis of the BH laser waveguide and the top surface of the buffer layer, which may serve as the alignment surface for aligning with an optical waveguide of the PIC chip in the vertical, or z-axis, direction. The vertical position of the optical axis may be accurately determined based on the known BH layer structure and material properties, as will be apparent to those skilled in the art, for example by simulations or optical measurements. In some embodiments it may be approximated by a centerline of the BH waveguide. Optionally, a selective etch may then be used to remove the buffer layer in a selected area of the chip so as to form one or more pillars 732, with the top surfaces of the pillars providing the alignment surface, as illustrated in FIG. 18C. In one embodiment the selective etching is performed so that the top surfaces of the pillars are not etched and are therefore substantially flat, thereby providing the alignment surfaces that are substantially flat. A protection layer 742 may be deposited over the etched are if desired.

It will be appreciated that other types of laser structures may also be used, as well as non-lasing semiconductor structures with optical waveguides that in some embodiments can be electrically biased, such as but not exclusively semiconductor optical amplifier, optical modulators, optical attenuators, and LEDs. Furthermore, in some embodiments the pillars that define the alignment surfaces can be fabricated using various area selective techniques such as but not limited to selective area epitaxial growth (SAG), evaporative or sputter deposition using lift-off techniques, or electroplating processes, so as to ensure the desired accuracy of the vertical alignment offset 777, preferably +\−200 nm or more preferably +\−100 nm.

In some embodiments the vertical alignment surface or surfaces of one of the semiconductor chips, for example the second chip to be flip-mounted on top of a first chip, may be provided in the recesses or trenches defined in a main face of the first chip. In some embodiments, one of the layers of a layer stack of the second chip may be used as an alignment layer. The material of that layer may be selected to be highly resistant to an etch technique that can remove layers grown on top of it. In some embodiments, the waveguide layer may be of a material that is etch-resistant and thus may serve as an etch-stop layer, for example with respect to a wet etch that may remove to the material of the upper and/or lower cladding layer. The intended etch stop layer can also be placed in the upper or lower cladding layers.

Figure 19A:
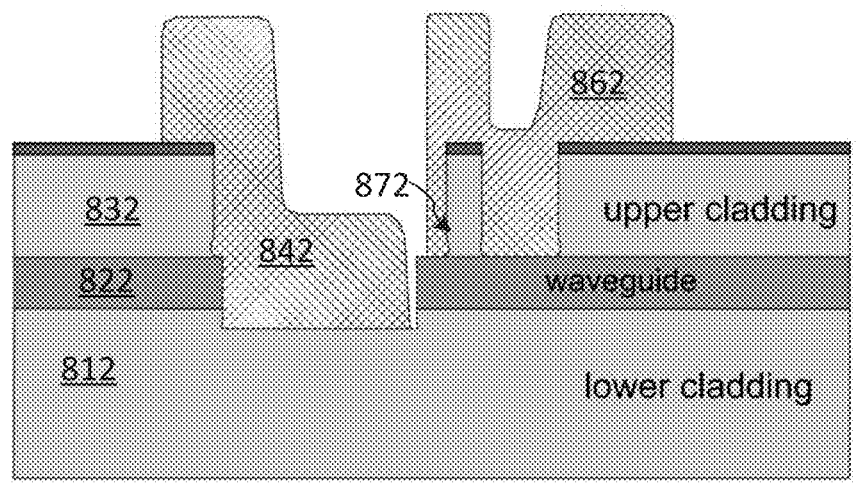
FIG. 19A is a schematic cross-sectional view of a second chip with a ridge waveguide defined in a waveguiding layer and electrical contacts configured for electrically biasing the ridge waveguide.
Figure 19B:
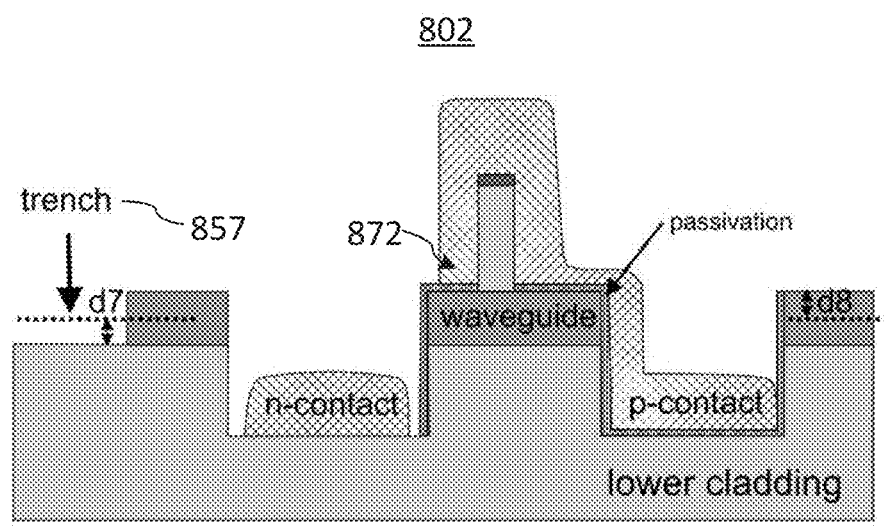
FIG. 19B is a schematic cross-sectional view of the second chip of FIG. 19A with the upper cladding and the waveguiding layer selectively removed at designated locations to form one or more alignment surfaces.

With reference to FIGS. 19A and 19B, there is schematically illustrated a cross-section of a second chip 802 with a ridge waveguide defined in a waveguiding layer and electrical contacts configured for electrically biasing the ridge waveguide before and after an etch to define vertical alignment surfaces in trenches or recesses of the structure. In a processing stage illustrated in FIG. 19A, the second chip 802 has a waveguiding layer 822 sandwiched between cladding layers 812 and 832. The waveguiding and top cladding layers 822, 832 have been selectively etched to define a ridge waveguide 872 and to allow an electrical contact to the lower cladding layer 812, which may be electrically conducting. Metal electrodes 842 and 862 are provided to electrically contact the cladding layers for electrically biasing the waveguiding layer 822 in the area of the ridge 872. In various embodiments the electrical biasing may be used to provide optical gain, or to attenuate or modulate light propagating in the waveguide. FIG. 19B illustrates the chip 802 after performing a selective etch to remove the top cladding in selected areas except in the area of the ridge waveguide 872. The etching step may involve a combination of a dry etch and a wet etch, or may be performed entirely using a suitable wet etch or etches that are selective to the materials of the waveguiding and/or cladding layers. In one embodiment, the waveguiding layer 822 itself may be selectively etched away at some areas of the chip to form a trench or trenches 857. An alignment surface may be provided by the exposed top surface of the waveguiding layer 822, and/or by the exposed area or areas of the lower cladding 812 in a trench 857. The corresponding vertical alignment offsets, i.e., the vertical offsets of the alignment surfaces from an optical plane or axis of the waveguiding layer, are indicated in FIG. 19B as 'd8' and 'd7', respectively. By way of example, the top cladding layer 832 may be formed of p-type InP, the waveguiding layer 822 may be formed of InGaAsP, and the bottom cladding layer 812 may be formed of n-type InP. Wet etch solutions that are capable of selective etching through InGaAsP but for which InP is an effective etch-stop are known in the art. Similarly, wet etch solutions that are capable of selective etching n-type InPand p-type InP but for which InGaAsP is an etch-stop are also known in the art.

In some embodiments, at least a portion of a hybrid semiconductor device assembled in accordance with the description in the present disclosure may be hermetically or semi-hermetically sealed. A hermetic seal is defined herein as an airtight seal, while the semi-hermetic seal is a seal that protects from outside dust and contamination but may not be air-tight. However, there may be various levels of hermeticity due to the different sizes of molecules that are airborne and the amount of time that it takes for one of those molecules to eventually penetrate the seal. For example molecules of hydrogen (H) are very small and can penetrate a seal much easier than a larger molecule like methane or other hydro-carbons. Hermetic seals are typically quantified by the rate at which helium (He) will penetrate the seal, given in units of cubic centimeters per second with a pressure differential of 1 atmosphere. This rate may be measured using a mass spectrometer at vacuum. Typical leak rates for non-polymer hermetic interfaces are from $10^{-8}$ to $10^{-9}$ cc/sec at 1 atmosphere. Example embodiments described herein relate to hermetic or semi-hermetic packaging of integrated photonics circuits at the chip or wafer level to achieve localized hermeticity or dust and contamination protection over sensitive areas of a single optical device chip or a collection of optical device chips. Hermeticity or semi-hermeticity on a local scale, that is where it is needed on a wafer or chip, may be achieved in two ways— by hermetically or semi-hermetically sealing the whole wafer or multi-chip assembly in a transparent glass or ceramic material, and by attaching a small lid over the sensitive area on the chip to provide a locally hermetic region on the chip. Such a lid may also serve to provide better heat sinking, and facilitate electrical connection from the chip's top surface.

Figure 20:
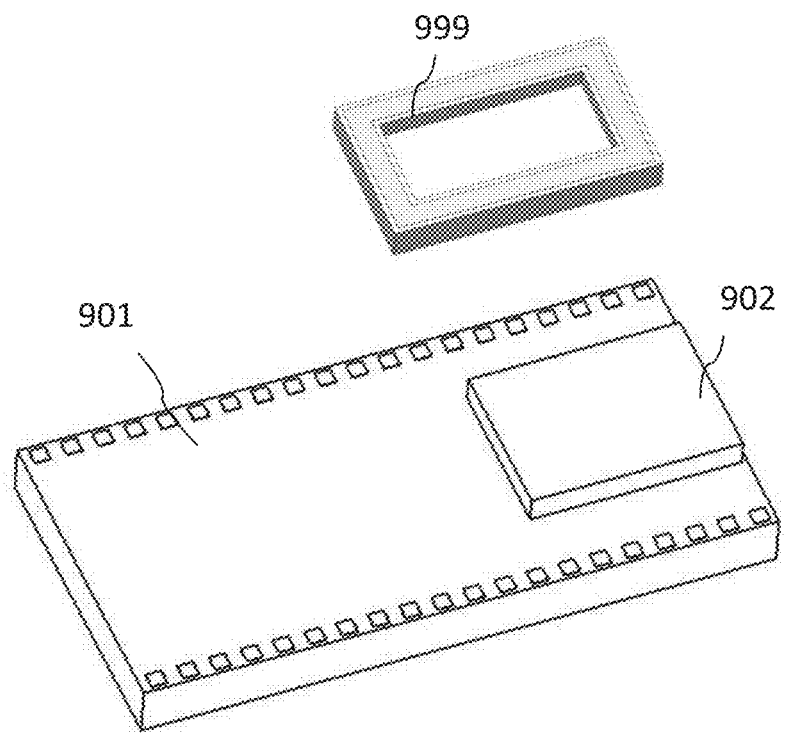
FIG. 20 is a schematic perspective view illustrating the placement of a hermetic lid over a second semiconductor chip disposed in a recess in a first semiconductor chip.
Figure 21:
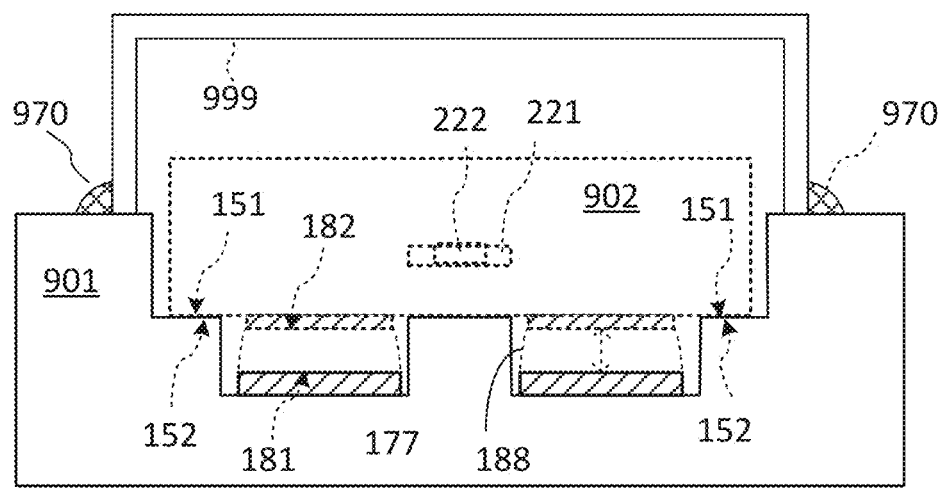
FIG. 21 is a schematic diagram showing a cross-section of a hybrid semiconductor device with a second semiconductor chip disposed in a recess in a first semiconductor chip and covered with a sealed lid.

With reference to FIGS. 20 and 21, in one embodiment an entire second chip 902 that is mounted onto a first chip 901 may be encapsulated by covering it with a lid 999, and optionally sealing the assembly using suitable sealing agents, such as for example solder and/or passivation materials. In some embodiments the lid may remain unsealed. The small lid 999 may be fabricated, for example, by etching a cavity in a thin piece of ceramic, glass, or metal, or using other suitable techniques and/or materials, to be placed over a sensitive area of the assembly. In one embodiment, the first chip 901 may be for example a SiP chip and the second chip 902 may be for example a laser gain chip. The second chip 902 may be optically aligned to the first chip 901 in the vertical, relative to the chip face, direction using alignment-stop surfaces 151, 152, and bonded to the top of the first chip 901, for example by a solder or another bonding agent 188 at the respective contact pads 181 and 182 of the chips, as illustrated in FIG. 21 and as described hereinabove with reference to FIGS. 8-10.

The second chip 902 mounted on top of the first chip 901, for example in a recess in the top face of the first chip 901, may be covered with the lid 999, and the lid may be bonded to the first chip around its circumference using a bonding agent 970, sealing in the entire second chip 901 and an optical beam it may generate. In one embodiment, the hermetic seal can be created by soldering the lid 999 down to the silicon photonics chip 901. In another embodiment, the lid 999 can be bonded to the chip 901 by another suitable material to form a hermetic or semi-hermetic seal. In some embodiments a layer of glass or ceramic may then be evaporated or sputtered on the device to create the hermetic seal around the lid 999. In one embodiment the inside surface of the lid 999 can be in mechanical, electrical and/or thermal communication with the top of the second chip 902 to provide improved heat sinking, and optionally to extend the electrical ground connection from the second chip 902 to the silicon photonics chip 901.

Principles of the present disclosure have been described hereinabove with reference to example embodiments wherein the semiconductor chips of a hybrid optical device are assembled so that one optical waveguide of a first chip is optically aligned to one optical waveguide of another chip. It will be appreciated, however, that the same principles, approaches, and techniques may be applied to chip assemblies wherein each of the chips includes multiple optical waveguides at matching relative locations. In particular, it will be appreciated that using alignment surfaces at precise epitaxially defined vertical offsets from a selected optical waveguide of a waveguide array to optically align that waveguide to a selected optical waveguide of a matching waveguide array of another chip will also result in other waveguides of the arrays being optically aligned between the chips.

Furthermore, although principles of the present disclosure have been described hereinabove with reference to example embodiments wherein one semiconductor chip having an optical waveguide is mounted on top of another semiconductor chip having an optical waveguide so their optical waveguides are aligned and optically coupled, in other embodiments two semiconductor chips having optical waveguides may be mounted on top of a common carrier so that their waveguides are aligned and optically coupled.

Figure 22:
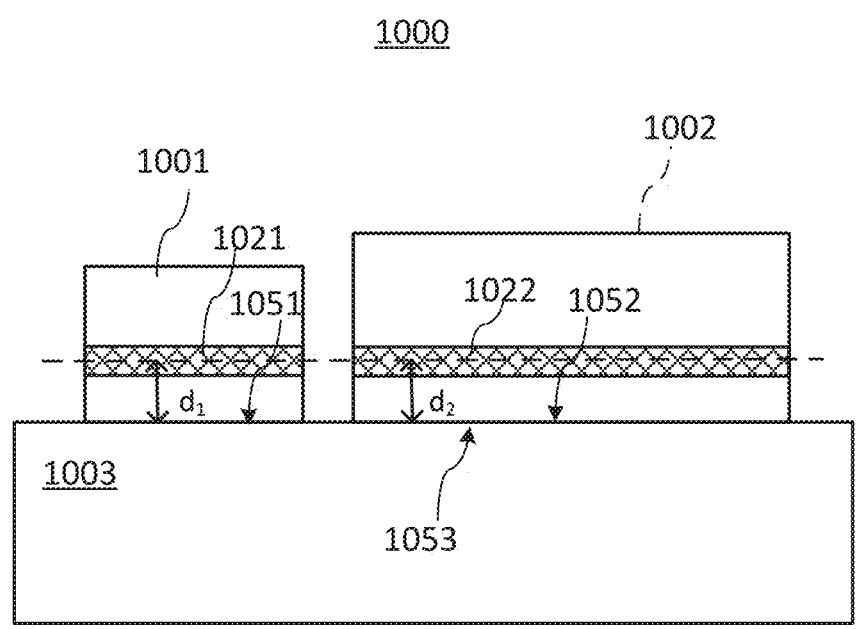
FIG. 22 is a schematic sectional side view of an example hybrid semiconductor device with two semiconductor chips optically aligned on a common carrier.

With reference to FIG. 22, in one embodiment an optically aligned hybrid semiconductor device 1000 may be formed of a first semiconductor chip 1001 and a second semiconductor chip 1002 disposed upon a common carrier 1003 having a carrier surface 1053. The first semiconductor chip 1001 is fabricated to have a first optical waveguide 1021 and a first alignment surface 1051 that is vertically offset from an optical axis of the first optical waveguide 1021 by a first offset d1 that is preferably epitaxially defined in the first semiconductor chip 1001. The second semiconductor chip 1002 is fabricated to have a second optical waveguide 1022 and a second alignment surface 1052 that is vertically offset from the optical axis of the second optical waveguide 1022 by a second offset d2 that is epitaxially defined in the second semiconductor chip 1002. The first and second semiconductor chips 1001, 1002 are disposed upon the common carrier 1003 with the first and second alignment surfaces 1051, 1052 abutting, and in contact with, the carrier surface 1053. The first and second distances $d_1$ and $d_2$ are such that when the first and second semiconductor chips 1001, 1002 are disposed upon the common carrier 1003 with the first and second alignment surfaces 1051, 1052 abutting, and in contact with, the carrier surface 1053, the first and second waveguides 1021, 1023 are optically aligned in the vertical direction.

In one embodiment the carrier surface 1053 upon which the chips 1001 and 1002 are mounted may be substantially flat, and the first offset d1 may be equal to the second offset d2. In one embodiment the carrier surface 1053 may have a recess or a pedestal defined therein within or upon which one of the chips 1001, 1002 may be disposed, and the first and second vertical offsets d1 and d2 may differ by the height of the recess or pedestal.

In some embodiments one or both of the chips 1001, 1002 may have contact or bonding pads disposed with a vertical offset with respect to the respective alignment surfaces 1051, 1052, for example in recesses defined in said surfaces, to be bonded to corresponding contact or bonding pads defined at the carrier surface 1053 in a manner similar to that described hereinabove with respect to FIGS. 8, 9. In another embodiment, contact or bonding pads provided at the common carrier 1003 may be disposed in recesses in the carrier surface 1053 to bond to corresponding contact or bonding pads provided at one or both of the semiconductor chips 1001, 1002.

An example of the common carrier may be an optical interposer that may serve as a common carrier for multiple semiconductor chips. An interposer is known as an element that provides a high speed electrical interface routing from one electronic device or connection to another. An interposer provides a single plane where multiple devices can connect to each other with short connection lengths for good high speed signal performance. An optical interposer may serve as a common support and/or optical interface for optical devices and may incorporate optical signal routing. A desirable feature of a process of assembling optical devices on an interposer is an ability to perform the optical alignment quickly and accurately. Wafer and die stacking may be performed using a diffusion bonding process that maintains a high accuracy vertical placement required for optical device assembly. This process may however require that the chips are polished flat first, and is generally compatible with the use of flat alignment-stop surfaces defined in the chips as described herein. A different bonding solution may use solder pads that are recessed in a cavity on one of the chips that are bonded together with a vertical stop to provide the required vertical placement accuracy, as described hereinabove by way of example with reference to FIGS. 8-10. Advantageously, the use of bonding pads that are vertically offset from flat alignment-stop surfaces in the chips doesn't require special CMP planarization and is compatible with current high production assembly processes. This bonding process could be used with other bonding geometries as well where the chip surface is not able to be processed with CMP.

In one embodiment a gain chip may be directly attached to the top of the second photonic device chip which is then flip-chip bonded to the optical interposer which may be Si-based and may have a cavity in it to provide clearance for the gain chip. A gain chip is understood herein to be a semiconductor chip incorporating an optical waveguide that may be electrically pumped to provide optical gain. An example of a gain chip is a chip incorporating a laser diode. The assembly may be performed using a "hard stop bonding process" described herein that is able of achieving a high accuracy vertical bonding placement of two photonic chips. A V-groove array may be etched into the silicon interposer using known processes by etching along the crystal planes. A trench at the back end is used to epoxy into it an acrylate jacket of an optical fiber array. The optical height of the fibers is controlled by the etch depth of the v-grooves and may be set, for example, to 1-10 microns above or below the surface, depending on the waveguide requirements of the silicon photonics chip.

Figure 23:
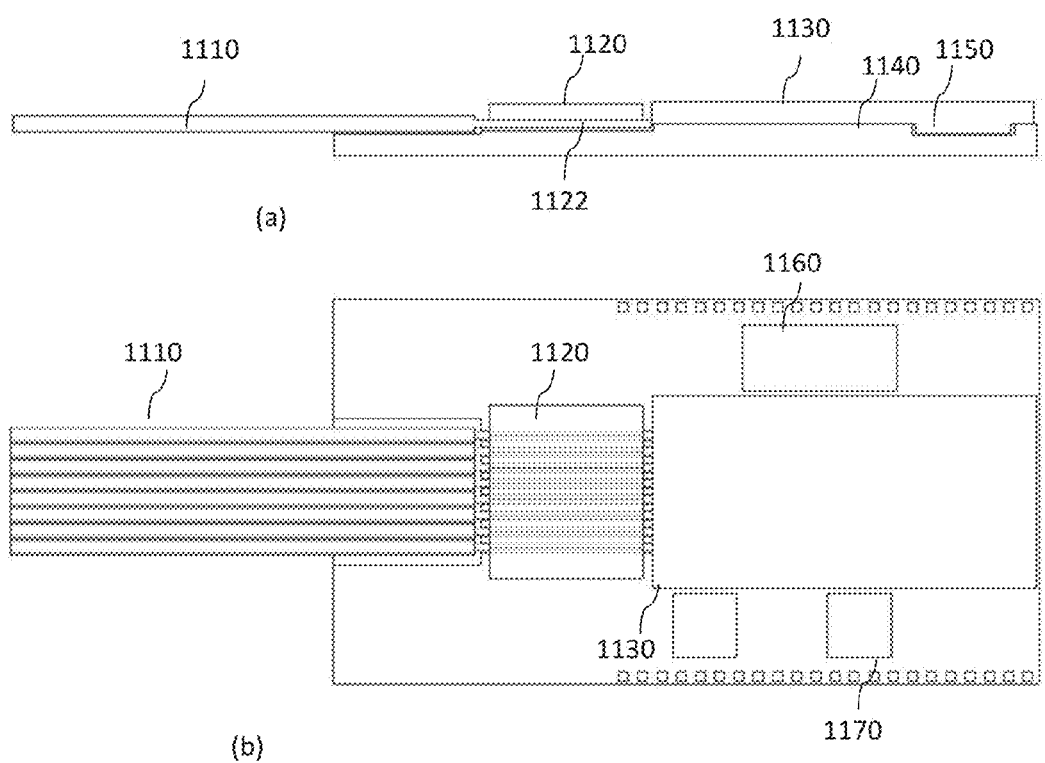
FIG. 23 is a schematic diagram of a gain chip and a SiP chip optically aligned on a common carrier and coupled to a fiber array in a side view (a) and a plan view (b).

With reference to FIG. 23, there is illustrated a schematic diagram of an example geometry for the alignment of a fiber array 1110 and a gain chip 1150 to a photonic chip assembly 1130. The photonic chip 1130 and the gain chip 1150 may be attached via flip-chip bonding process, for example as described hereinabove. The bonding process for this geometry may be carried out using a diffusion bonding technique or a hard stop bonding technique described hereinabove. An assembly composing the photonic chip 1130 and gain chip 1150 may then be attached to an interposer 1140, again using a diffusion bonding technique or a hard stop bonding technique described hereinabove. Fibers of the optical fiber array 1110 may be placed in grooves in the interposer 1140 that align the fibers with respect to the photonic chip 1130. A glass plate 1120 is placed over the smaller diameter end portion of the fibers 1122 in order to secure them in place, and epoxy may be used to secure the glass plate 1120 to the interposer 1140. Electrical contact between the photonic chip 1150 and the interposer 1140 may facilitate electrical paths to other electronic chips 1160 and 1170 that may be bonded to the interposer 1140.

In another embodiment, the gain chip may be hard-stop bonded into a cavity that is etched into the photonic chip using alignment-stop surfaces for vertical alignment and recessed bonding pads as described hereinabove to align the optical waveguides of both chips. The hard stop bonding may be achieved, for example, by etching shallow cavities into the silicon photonics chip, optionally using a metal layer stop for a precise control of the etch depth. Additional metallic layers may then be added at the bottom of the cavity to provide a contact point to the interposer. Likewise, the interposer may have receiving pads that will contact with the silicon photonics chip. Contact may be made with a thin solder cap on one or both of the metal pads on each chip. Excess melted solder material will bulge or drip into the cavity instead of getting between the two chips and affecting their expected placement along the Z-axis. The optical alignment of the interposer may be achieved by "flip-chip" bonding the silicon photonics chip face down onto the interposer and aligning its optical waveguide to the v-groove positions in the plane of the interposer surface. The gain chip maybe placed directly into a cavity in the second photonic chip that is then flip chip bonded to the interposer. The temperature of the two parts may then be raised to melt the solder material, and the two components bond down to the point where the two alignment surfaces contact each other on the hard stop. The temperature may then be lowered and the parts released and tested for electrical continuity. Alternatively, bonding the photonics chip to the interposer could also be done using a diffusion bonding process. The ground side of the upside-down gain chip may be connected to the cavity in the interposer to provide improved thermal performance and a better ground connection. This can be achieved with either a solder or conductive epoxy material. Finally, the fiber array is placed passively into position on the interposer, butted up against the silicon photonics chip and epoxied into position with a glass plate above them to give them support from above.

Advantageously, the afore-described optical chip assembly techniques that utilize epitaxially-defined alignment-stop surfaces at precise epitaxially-defined complimentary vertical offsets from optical axes or planes of the chips' waveguides enable accurate passive optical alignment of the optical waveguides of two chips in the vertical, or z-axis, direction, i.e., the direction that is normal to the plane of the chips. Precision-placement equipment used in modern semiconductor manufacturing may then be used to align the chips' waveguides in the (x.y) plane of the chips, optionally with the assistance of an active alignment technique when available, and/or with a possible assistance of camera-based imaging. Epitaxial growth techniques, such as but not limited to vapour phase epitaxy (VPE), liquid phase epitaxy (LPE), molecular beam epitaxy (MBE), chemical vapour deposition (CVD), and metal-organic chemical vapour deposition (MOCVD), leverage the extremely tight variance control that can be achieved in the layers of a semiconductor wafer. The deposition techniques and layer thickness can be controlled during epitaxy to nanometer (nm) precision, and thickness uniformity across the wafer can be held with nm tolerance. Special layers in the epitaxial structure, such as for example an InP based PIC, can be used to selectively stop an etch with nm precision. By utilizing these techniques, the z-height tolerance can be reduced to nm variations where the height dimensions of mechanical alignment structures are defined by combinations of the semiconductor epitaxial design and growth and the mask and etching processes. Thus utilizing epitaxially-defined alignment-stop surfaces at precise epitaxially-defined vertical offsets from waveguides or waveguides' optical axes also helps in solving a problem of tolerance buildup for aligning optical waveguide structures between different photonic integrated circuits (PICs), which otherwise may prohibit low loss passive alignment or low cost fast active alignment. The large tolerance build-ups may typically come from thickness variations in gold and other metals when metal layers are employed for inter-chip alignment, as well as variations in the thickness of deposited materials whose thickness cannot be tightly controlled.

The above-described exemplary embodiments are intended to be illustrative in all respects, rather than restrictive, of the present invention. Indeed, various other embodiments and modifications to the present disclosure, in addition to those described herein, will be apparent to those of ordinary skill in the art from the foregoing description and accompanying drawings. Thus, such other embodiments and modifications are intended to fall within the scope of the present disclosure.

For example, it will be appreciated that although example embodiments described hereinabove relate to optical alignment of two chips to form a single hybrid optical device, in other embodiments substantially the same method and techniques may be used for wafer-to wafer and chip-to wafer alignment, for example to integrate and optically align two wafers so that a plurality of optical waveguides defined in a first wafer is optically coupled to a plurality of optical waveguides defined in a second wafer, or to mount one or more optical chips on a wafer while optically aligning the chips to respective waveguides defined in the wafer. Thus, the term "chip" as used here should be understood to encompass a wafer or any portion of a wafer.

Furthermore, it will be appreciated that semiconductor materials other than silicon, including but not limited to compound semiconductor materials such as GaAs, InP, and their alloys, as well as various dielectric materials such as but not limited to glasses, ceramics and polymers, may be used to fabricate the hybrid optically-aligned device with optically aligned waveguides on adjacent chips. For example, at least one of the first or second chips 101, 102 described hereinabove may be a non-semiconductor chip, including a non-semiconductor wafer.

Further for example, although in the example embodiments described hereinabove the optical waveguides of the first and second chips are shown to be butt-coupled, i.e., disposed so that light from an end-face of one waveguide is coupled directly into the end-face of another waveguide, other embodiments may include coupling optics disposed between the end-faces of the waveguides, such as but not limited to a ball lens or an aspheric lens.

Furthermore although in the example embodiments described herein the optical waveguides are aligned for end-face optical coupling wherein their optical axes and/or places are substantially coincidental, the vertical alignment techniques using alignment-stop surfaces at precise vertical offsets from the waveguide's axes of the present disclosure may also be adopted to align the optical chips for transverse transfer coupling of their waveguides, in which the waveguides extend alongside each other along a common length thereof. Furthermore, it will be appreciated that the optical waveguides of one or each of the chips being optically aligned may terminate at an angle and/or have angled end-faces, for example to reduce back-reflections, as may be lithographically defined in one or both of the chips. Furthermore, in some embodiments the waveguides may have end-faces that are angled with respect to the vertical direction that is normal to the plane of the chip, wafer, or waveguide. In such embodiments the first and second offsets, which define the vertical location of the alignment layers relative to the optical axes of the waveguides, may differ in value and complement each other in a manner that leads to a small vertical offset between the optical waveguides of the first and second chips in the assembled hybrid device that is selected so as to maximize, or at least increase, optical coupling between the waveguides when the endfaces of the waveguides are angled and non-vertical. Furthermore, in some embodiments at least one of the first and second offsets may be zero.

Furthermore, although in some of the example embodiments described hereinabove the z-axis position of the alignment surfaces of both the carrier semiconductor chip and the semiconductor chip to be mounted on top of the carrier chip in their respective layer stacks are defined by epitaxy so as to ensure that their offsets from the respective optical waveguides or optical axes are accurately defined by epitaxy, it may be sufficient that only one of the alignment surfaces is defined by epitaxy so that its offset from the optical axis of its respective waveguide precisely complements the alignment surface—optical axis offset of the other chip. Furthermore, in other embodiments the alignment surfaces may be formed by high-precision techniques other than epitaxy, such as for example precision etching, non-epitaxial deposition, metallization, CMP, and other. Preferably, such techniques should provide the desired accuracy of the first and second offsets that define the alignment surfaces' vertical positions relative to the respective optical waveguides, preferably within +\−200 nm. In some embodiments, the alignment surface offsets may be allowed to deviate within +\−1 micron or more from their target values, for example when the optical waveguides are provided with well-engineered mode expanders.

Furthermore, although the theoretical description that may be given herein is thought to be correct, the operation of the devices described and claimed herein does not depend upon the accuracy or validity of the theoretical description. That is, later theoretical developments that may explain the observed results on a basis different from the theory presented herein will not detract from the inventions described herein.

Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes.

Thus the present invention is capable of many variations in detailed implementation that can be derived from the description contained herein by a person skilled in the art. All such variations and modifications are considered to be within the scope and spirit of the present invention as defined by the following claims.

What is claimed is:

1. A method of fabricating an optically aligned hybrid semiconductor device, the method comprising:
   a) providing a first semiconductor chip comprising a first alignment surface, a first bonding pad, and a first optical waveguide, wherein the first alignment surface is positioned with a first offset from an optical axis of the first optical waveguide;
   b) providing a second semiconductor chip comprising a second alignment surface, a second bonding pad, and a second optical waveguide, wherein the second alignment surface is positioned with a second offset from an optical axis of the second optical waveguide, wherein one of the first and second offsets is epitaxially-defined in the respective first or second semiconductor chip to complement the other of the first and second offsets so that when the first and second alignment surfaces are in contact abutting each other, the first and second waveguides are aligned in a direction normal to the first and second alignment surfaces;
   c) aligning first and second semiconductor chips with the first and second alignment surfaces facing each other; and,
   d) bringing the first and second semiconductor chips together until the first and second alignment surfaces come to a stop against each other, with the first and second alignment surfaces being in direct contact with each other and the first and second optical waveguides being optically coupled,
   wherein providing at least one of the first and second semiconductor chips includes:
   growing a stack of epitaxial layers comprising the first or second optical waveguide sandwiched between two cladding layers, and
   forming one of the first alignment surface or the second alignment surface by selectively etching the stack of epitaxial layers using a layer-selective etch so as to expose at least an area of an epitaxy-defined layer surface of one of the epitaxial layers of the stack;
   wherein one of the first and second bonding pads is offset relative to one of the first or second alignment surfaces in the respective first or second semiconductor chips so that when the first and second alignment surfaces are brought in contact with each other in step (d), there exists a gap G between the first and second bonding pads.

2. The method of claim 1, further comprising disposing a compliant bonding agent upon at least one of the first and second bonding pads prior to (d), and causing the compliant bonding agent to connect the bonding pads in step (d).

3. The method of claim 2 wherein the bonding pads are electrically conductive, wherein the bonding agent comprises electrically conducting solder, and wherein the method includes heating the electrically conducting solder to a near-melting temperature.

4. An optically aligned hybrid semiconductor device comprising:
   a first semiconductor chip comprising a first alignment surface and a first optical waveguide having an optical axis, wherein the first alignment surface is positioned with a first offset from the optical axis of the first optical waveguide, wherein the first semiconductor chip comprises a substrate; and,
   a second semiconductor chip comprising a second alignment surface and a second optical waveguide having an optical axis, wherein the second alignment surface is positioned with a second offset from the optical axis of the second optical waveguide, wherein the second offset is complementary to the first offset, wherein the second semiconductor chip comprises a compound semiconductor substrate and a stack of epitaxial layers grown thereupon so as to define the second alignment surface at an exposed surface of one of the epitaxial layers of the stack; and
   wherein the second semiconductor chip is disposed upon the first semiconductor chip so that the second alignment surface directly abuts the first alignment surface in a contact therewith, and the first and second optical waveguides are aligned and optically coupled;
   wherein each of the first and second semiconductor chips further comprises a bonding pad, said bonding pads disposed to face each other with a gap therebetween,
   wherein the gap comprises a bonding agent for bonding the second chip to the first chip, and wherein one of the bonding pads is disposed upon a surface of the second semiconductor chip that is offset from the second alignment surface.

5. A method of fabricating an optically aligned hybrid semiconductor device, the method comprising:
 a) obtaining a first semiconductor chip comprising a first alignment surface and a first optical waveguide formed upon a substrate, wherein the first alignment surface is positioned with a first offset from an optical axis of the first optical waveguide;
 b) obtaining a second semiconductor chip comprising a second alignment surface and a second optical waveguide formed upon a compound semiconductor substrate, wherein the second alignment surface is positioned with a second offset from an optical axis of the second optical waveguide, wherein the first and second offsets are complementary so that when the first and second alignment surfaces are in contact with each other, the first and second waveguides extend in a common plane;
 wherein obtaining the second semiconductor chip includes using thickness-controlled epitaxy to grow a first stack of epitaxial layers upon the compound semiconductor substrate so as to define a position of the second alignment surface in the first stack of epitaxial layers at a layer surface of a top epitaxial layer thereof;
 c) aligning first and second semiconductor chips with the first and second alignment surfaces facing each other; and,
 d) bringing the first and second semiconductor chips together until the first and second alignment surfaces come to a stop against each other, with the first and second alignment surfaces being in direct contact abutting each other and the first and second optical waveguides being optically coupled;
 providing each of the first and second semiconductor chips with a bonding pad that is electrically conducting and is disposed upon an electrically conducting surface of the respective chip, the bonding pads positioned to face each other with a gap therebetween when the first and second semiconductor chips brought together in step (d) and the first and second alignment surfaces are in direct contact abutting each other;
 depositing a compliant electrically conducting bonding agent upon at least one of the bonding pads to a total height exceeding the gap;
 wherein d) comprises:
 bringing the first and second semiconductor chips together to first cause the compliant electrically conducting bonding agent to touch the bonding pads of both the first and second semiconductor chip;
 bringing the first and second semiconductor chips further together until the first and second alignment surfaces come to a stop against each other; and,
 causing the compliant electrically conducting agent to solidify, thereby providing electrical and mechanical bonding between the first and second semiconductor chips.

6. The method of claim 5, wherein step a) comprises:
 growing a second stack of epitaxial layers including the first optical waveguide, a cladding layer, and an etch-stop layer with a top layer surface of the etch-stop layer disposed at the first offset from an optical plane of the first optical waveguide, and
 selectively etching the second stack of epitaxial layers up to the etch stop layer so as to expose at least an area thereof to form the first alignment surface.

7. The method of claim 1, wherein step a) comprises:
 growing a first stack of epitaxial layers including the first optical waveguide, a cladding layer, and an etch-stop layer with a top layer surface of the etch-stop layer disposed at the first offset from an optical plane of the first optical waveguide, and
 selectively etching the first stack of epitaxial layers up to the etch stop layer so as to expose at least an area thereof to form the first alignment surface.

8. The method of claim 1, wherein step b) comprises using thickness-controlled epitaxy to grow a second stack of epitaxial layers upon a compound semiconductor substrate so as to define a position of the second alignment surface in the second stack of epitaxial layers at a layer surface of a top epitaxial layer thereof.

9. The device of claim 4, wherein the first semiconductor chip includes a cladding layer, and an etch-stop layer with a top layer surface of the etch-stop layer disposed at the first offset from an optical plane of the first optical waveguide, and
 wherein the first alignment surface comprises an exposed area of the etch stop layer.

10. The device of claim 4, wherein the second semiconductor chip includes a second stack of epitaxial layers upon the substrate; and wherein the second alignment surface comprises a layer surface of a top epitaxial layer thereof.

* * * * *